US008689166B2

(12) United States Patent
Lu

(10) Patent No.: US 8,689,166 B2
(45) Date of Patent: Apr. 1, 2014

(54) MODELING THE TOTAL PARASITIC RESISTANCES OF THE SOURCE/DRAIN REGIONS OF A MULTI-FIN MULTI-GATE FIELD EFFECT TRANSISTOR

(75) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 13/455,181

(22) Filed: Apr. 25, 2012

(65) Prior Publication Data
US 2013/0289964 A1 Oct. 31, 2013

(51) Int. Cl.
G06F 17/50 (2006.01)

(52) U.S. Cl.
USPC .............. 716/126; 716/55; 716/104; 716/119

(58) Field of Classification Search
USPC .................................. 716/55, 104, 119, 126
See application file for complete search history.

(56) References Cited

U.S. PATENT DOCUMENTS

| 4,939,681 | A | 7/1990 | Yokomizo et al. |
| 5,467,291 | A | 11/1995 | Fan et al. |
| 6,662,350 | B2 | 12/2003 | Fried et al. |
| 6,898,561 | B1 | 5/2005 | Liu et al. |
| 7,224,029 | B2 | 5/2007 | Anderson et al. |
| 7,227,183 | B2 * | 6/2007 | Donze et al. ................... 257/48 |
| 7,851,283 | B2 | 12/2010 | Anderson et al. |
| 7,888,750 | B2 | 2/2011 | Anderson et al. |
| 8,132,139 | B2 * | 3/2012 | Asai ............................. 716/115 |

FOREIGN PATENT DOCUMENTS

KR          20090115492 A          11/2009

OTHER PUBLICATIONS

Disclosed Anonymously, "Method and System for Characterizing and Modeling a Multi-Fin FinFET as a Unit," IPCOM000211613D, Oct. 13, 2011, 5 pages.
Cheng, et al., "16-nm Multigate and Multifin MOSFET Device and SRAM Circuits," 978-1-4244-6694-8/10, IEEE, 2010, pp. 32-35.
Lu, D., "Modeling of FinFET Parasitic Source and Drain Resistances," PhD Dissertation: Compact Models for Future Generation CMOS, Electrical Engineering and Computer Science University of California at Berkeley, Technical Report No. UCB/EECS-2001-69, Chapter 4., May 30, 2011, p. 52-76.
Xu, et al., "Predicitive Modeling of Capacitance and resistance in Gate-all-around Cylindrical Nanowire Mosfets for Parasitic Design Optimization," 978-1-4244-8798-4/10, IEEE, 2010, 3 pages.

(Continued)

Primary Examiner — Thuan Do
(74) Attorney, Agent, or Firm — Gibb & Riley, LLC; Anthony J. Canale

(57) ABSTRACT

In the embodiments, a full resistive network is used to determine resistance contributions to the total parasitic resistance of each source/drain region of a multi-fin multi-gate field effect transistor (MUGFET). These resistance contributions include: a first resistance contribution of end portions of the fins, which are connected in pseudo-parallel by a local interconnect; second resistance contributions of segments of the local interconnect, which are connected in pseudo-series; and any other resistance contributions of any other resistive elements between the end portions of the fins and a single resistive element through which all the diffusion region current flows. The multi-fin MUGFET is then represented in a netlist as a simple field effect transistor with the total parasitic resistances represented as single resistive elements connected to the source/drain nodes of that field effect transistor. This simplified netlist is then used to simulate performance of the multi-fin MUGFET.

24 Claims, 16 Drawing Sheets

(56) References Cited

OTHER PUBLICATIONS

Wu et al., "Analysis of Geometry-Dependent Parasitics in Multifin Double-Gate FinFETs," Transactions on Electron Devices, vol. 54, No. 4, Apr. 2007, pp. 692-698.

Song, et al., "A Review on Compact Modeling of Multiple-Gate MOSFETs," IEEE Transactions on Circuits and Systems-I: Regular Papers, vol. 56, No. 8, Aug. 2009, pp. 1858-1869.

Lu, et al., "Characterization, Simulation, and Modeling of FET Source/Drain Diffusion Resistance," IEEE 2008 Custom Intergrated Circuits Conference (CICC), 2008, pp. 281-284.

U.S. Appl. No. 13/359,615, filed Jan. 27, 2012, Bryant, et al., "Field Effect Transistor and a Method of Forming the Transistor".

Sriramkumar V., et al., Multi-Gate MOSFET Compact Model, Technical Manual, BSIM-CMG 106.0.0, Department of Electrical Engineering and Computer Sciences, University of California, Berkeley, CA, 2012 p. 36-51.

\* cited by examiner

MODELING THE TOTAL PARASITIC RESISTANCES OF THE SOURCE/DRAIN REGIONS OF A MULTI-FIN MULTI-GATE FIELD EFFECT TRANSISTOR

BACKGROUND

1. Field of the Invention

The embodiments disclosed herein relate to modeling parasitic resistances in semiconductor devices and, more particularly, to embodiments of a method, a system and a program storage device for modeling the total parasitic resistances of the source/drain regions of a multi-gate field effect transistor (MUGFET), which incorporates multiple semiconductor fins.

2. Description of the Related Art

The resistances associated with the source/drain regions of a field effect transistor (FET) are relatively large parasitic resistances that will impact performance. Thus, during FET design, accurate modeling of the total parasitic resistances of the source/drain regions is very important. Various techniques are well known in the art for modeling the total parasitic resistances of the source/drain regions of conventional planar FETs. Recently, however, multi-gate non-planar field effect transistors (MUGFETs) (e.g., dual-gate non-planar FETs, also referred to herein as fin-type FETs (FINFETs), and tri-gate non-planar FETs) and, particularly, multi-fin MUGFETs have been developed to provide reduced-size field effect transistors, while simultaneously providing enhanced control in short channel effects (SCE) and reducing drain induced barrier lowering (DIBL) significantly. Unfortunately, for such multi-fin MUGFETs, the prior art modeling techniques do not provide accurate results without dramatically increasing simulation time. Therefore, there is a need in the art for technique that can be used to more accurately model diffusion region resistance of multi-fin MUGFETs with a much smaller transistor network.

SUMMARY

In view of the foregoing, disclosed herein are embodiments of a method, system and program storage device for accurately modeling the total parasitic resistances of the source/drain regions of a multi-fin multi-gate field effect transistor (i.e., a multi-fin MUGFET). Specifically, in the embodiments, a full resistive network is first constructed for a multi-fin MUGFET design and, using this full resistive network, various resistance contributions to the total parasitic resistances associated with the source/drain regions of the MUGFET are determined. These resistance contributions include the following: a first resistance contribution of end portions of the semiconductor fins, which are connected in pseudo-parallel by a local interconnect; second resistance contributions of segments of the local interconnect, which are connected in pseudo-series; and any other resistance contributions of any other resistive elements, which are within the resistive network between the end portions of the semiconductor fins and a single resistive element through which all the diffusion region current flows. It should be noted that each second resistance contribution of each segment of the local interconnect is particularly determined based on a quantized fractional current amount flowing through that segment given the relative positions, within the resistive network, of contact(s) on the local interconnect, of the segment within the local interconnect and of other segments within the local interconnect. Then, the multi-fin MUGFET can be represented in a netlist as a simple field effect transistor with the total parasitic resistances represented as single resistive elements connected to the source/drain nodes of the simple field effect transistor. This simplified netlist can then be used to simulate performance of the multi-fin MUGFET.

More particularly, in one embodiment of a computer-implemented modeling method as disclosed herein, a design for a multi-fin field effect transistor (multi-fin MUGFET) can be accessed. This multi-fin MUGFET can comprise multiple semiconductor fins and a gate structure that traverses the center portions of the multiple semiconductor fins. Local interconnects can be positioned on opposite sides of the gate structure. Specifically, a first local interconnect can electrically connect end portions of the multiple semiconductor fins on a first side of the gate structure and a second local interconnect electrically connecting end portions of said multiple semiconductor fins on a second side of the gate structure opposite the first side. Contacts can extend vertically to the local interconnects (e.g., a single contact can extend vertically to the first local interconnect and one or more contacts can extend vertically to the second local interconnect).

The method can further comprise determining the total parasitic resistances associated with the source/drain regions of the multi-fin MUGFET on the opposite sides of the gate structure. Specifically, a first total parasitic resistance associated with a first source/drain region on the first side of the gate structure can be determined and a second total parasitic resistance associated with a second source/drain region on the second side of the gate structure can also be determined. Each total parasitic resistance of each source/drain region can comprise the sum of various resistance contributions. For example, for the first source/drain region wherein the first local interconnect is contacted by a single contact, these resistance contributions can include a first resistance contribution of the end portions of the fins; second resistance contributions of segments of the local interconnect, where each second resistance contribution is associated with a corresponding segment of the local interconnect and is dependent on the relative positions of both the contact on the local interconnect and the corresponding segment within the local interconnect; and a third resistance contribution of the contact.

Next, the multi-fin MUGFET can be represented in a netlist as a simple field effect transistor and the total parasitic resistances of the source/drain regions can be represented as single resistive elements connected to source/drain nodes, respectively, of the simple field effect transistor. That is, the first total parasitic resistance can be represented in the netlist by a first resistive element connected to a first source/drain node of the simple field effect transistor and the second total parasitic resistance can be represented in the netlist by a second resistive element connected to a second source/drain node of the simple field effect transistor. This simplified netlist can then be used to simulate performance of the multi-fin MUGFET.

In another embodiment of a computer-implemented modeling method as disclosed herein, a design for a multi-fin field effect transistor (multi-fin MUGFET) can similarly be accessed. In this case, however, one or both of the local interconnects can be contacted by multiple contacts. Specifically, in this case, the multi-fin MUGFET can comprise multiple semiconductor fins and a gate structure that traverses the center portions of the multiple semiconductor fins. A first local interconnect can electrically connecting end portions of the multiple semiconductor fins on first side of the gate structure and a second local interconnect electrically connecting end portions of the multiple semiconductor fins on a second side of the gate structure opposite the first side. Contacts can extend vertically to the first and second local interconnects and, for at least one of the local interconnects, multiple contacts can extend vertically between a wire and that local interconnect (e.g., the first local interconnect).

As in the previously described embodiment, the total parasitic resistances associated with the source/drain regions of the multi-fin MUGFET on opposite sides of the gate structure can be determined. That is, a first total parasitic resistance associated with a first source/drain region on the first side of the gate structure can be determined and a second total parasitic resistance associated with a second source/drain region on the second side of the gate structure can also be determined. As in the previously described embodiment, the total parasitic resistance of each source/drain region is based on the sum of various resistance contributions. However, in this case because the first local interconnect is contacted by multiple contacts, which alter current flow, the first total parasitic resistance must take into account additional resistance contributions. That is, the first total parasitic resistance can comprise the sum of the following: a first resistance contribution of the end portions of the fins on the first side of the gate structure; second resistance contributions of segments of the first local interconnect, where each second resistance contribution is associated with a corresponding segment of the first local interconnect and is dependent on the relative positions of both the contacts on the first local interconnect and the corresponding segment within the first local interconnect; third resistance contributions of the contacts; and fourth resistance contributions of segments of the wire.

Next, the multi-fin MUGFET can be represented in a netlist as a simple field effect transistor and the total parasitic resistances of the source/drain regions can be represented as single resistive elements connected to source/drain nodes, respectively, of the simple field effect transistor. That is, the first total parasitic resistance can be represented in the netlist by a first resistive element connected to a first source/drain node of the simple field effect transistor and the second total parasitic resistance can be represented in the netlist by a second resistive element connected to a second source/drain node of the simple field effect transistor. This simplified netlist can then be used to simulate performance of the multi-fin MUGFET.

Also disclosed herein is an embodiment of a modeling system. The modeling system can comprise a memory and at least one processor in communication with the memory.

The memory can store a design for a multi-fin field effect transistor (multi-fin MUGFET). This multi-fin MUGFET can comprise multiple semiconductor fins and a gate structure that traverses the center portions of the multiple semiconductor fins. Local interconnects can be positioned on opposite sides of the gate structure. Specifically, a first local interconnect can electrically connect end portions of the multiple semiconductor fins on a first side of the gate structure and a second local interconnect electrically connecting end portions of said multiple semiconductor fins on a second side of the gate structure opposite the first side. Contacts can extend vertically to the local interconnects (e.g., a single contact can extend vertically to the first local interconnect and one or more contacts can extend vertically to the second local interconnect).

The processor can access the design and perform various additional process steps with respect to the design. Specifically, the processor can analyze the design to determine the total parasitic resistances associated with the source/drain regions of the multi-fin MUGFET on opposite sides of the gate structure. That is, the processor can determine a first total parasitic resistance associated with a first source/drain region on the first side of the gate structure and a second total parasitic resistance associated with a second source/drain region on the second side of the gate structure. Each total parasitic resistance of each source/drain region can comprise the sum of various resistance contributions. For example, for the first source/drain region wherein the first local interconnect is contacted by a single contact, these resistance contributions can include a first resistance contribution of the end portions of the fins; second resistance contributions of segments of the local interconnect, where each second resistance contribution is associated with a corresponding segment of the local interconnect and is dependent on the relative positions of both the contact on the local interconnect and the corresponding segment within the local interconnect; and a third resistance contribution of the contact.

Next, the same or a different processor can further represent the multi-fin MUGFET as a simple field effect transistor in a netlist and can represent the total parasitic resistances in the netlist as single resistive elements connected to source/drain nodes, respectively, of the simple field effect transistor. That is, the first total parasitic resistance can be represented in the netlist by a first resistive element connected to a first source/drain node of the simple field effect transistor and the second total parasitic resistance can be represented in the netlist by a second resistive element connected to a second source/drain node of the simple field effect transistor. The same or a different processor can then use the simplified netlist to simulate the performance of the multi-fin MUGFET.

Another embodiment of a modeling system as disclosed herein can similarly comprise a memory and at least one processor. In this case, the memory can store a design for a multi-fin field effect transistor (multi-fin MUGFET) where one or both of the local interconnects are contacted by multiple contacts. Specifically, in this case, the multi-fin MUGFET can comprise multiple semiconductor fins and a gate structure that traverses the center portions of the multiple semiconductor fins. A first local interconnect can electrically connecting end portions of the multiple semiconductor fins on first side of the gate structure and a second local interconnect electrically connecting end portions of the multiple semiconductor fins on a second side of the gate structure opposite the first side. Contacts can extend vertically to the first and second local interconnects and, for at least one of the local interconnects, multiple contacts can extend vertically between a wire and that local interconnect (e.g., the first local interconnect).

A processor can access the design and perform various additional process steps with respect to the design. Specifically, the processor can analyze the design to determine the total parasitic resistances associated with the source/drain regions of the multi-fin MUGFET on opposite sides of the gate structure. That is, the processor can determine a first total parasitic resistance associated with a first source/drain region on the first side of the gate structure and a second total parasitic resistance associated with a second source/drain region on the second side of the gate structure. As in the previously described embodiment, the total parasitic resistance of each source/drain region is based on the sum of various resistance contributions. However, since the first local interconnect is contacted by multiple contacts, which alter current flow, the first total parasitic resistance of the first source/drain region must take into account additional resistance contributions. That is, the first total parasitic resistance can comprise the sum of the following: a first resistance contribution of the end portions of the fins on the first side of the gate structure; second resistance contributions of segments of the first local interconnect, where each second resistance contribution is associated with a corresponding segment of the first local interconnect and is dependent on the relative positions of both the contacts on the first local interconnect and the corresponding segment within the first local interconnect; third resistance contributions of the contacts; and fourth resistance contributions of segments of the wire.

Next, the same or a different processor can further represent the multi-fin MUGFET as a simple field effect transistor in a netlist and can represent the total parasitic resistances in the netlist as single resistive elements connected to source/drain nodes, respectively, of the simple field effect transistor. That is, the first total parasitic resistance can be represented in the netlist by a first resistive element connected to a first source/drain node of the simple field effect transistor and the second total parasitic resistance can be represented in the netlist by a second resistive element connected to a second source/drain node of the simple field effect transistor. The same or a different processor can then use the simplified netlist to simulate the performance of the multi-fin MUGFET.

Also disclosed herein are embodiments of a non-transitory program storage device. This program storage device can be readable by a computer and can tangibly embody a program of instructions that is executable by the computer to perform the above-described modeling method.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
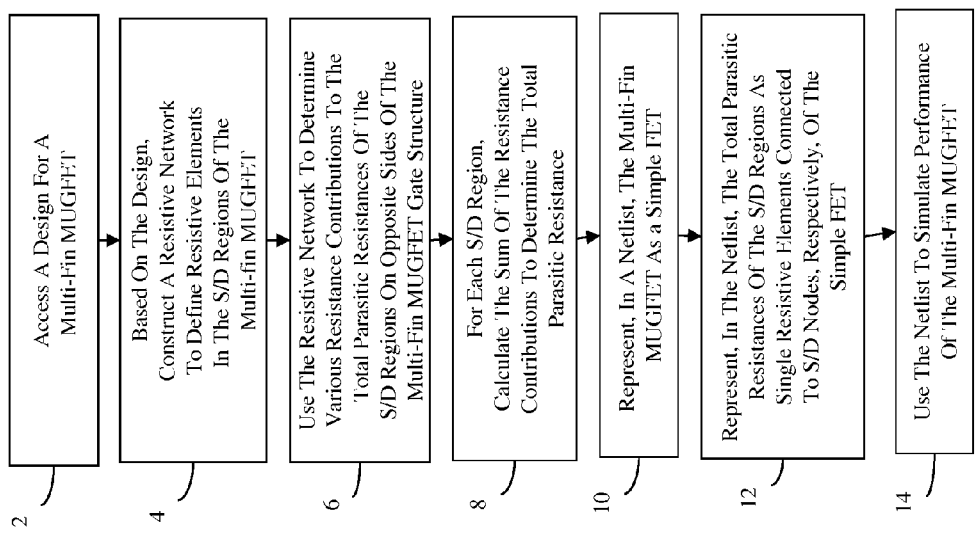
FIG. 1 is a flow diagram illustrating embodiments of a computer-implemented method for accurately modeling the total parasitic resistances of the source/drain regions of a multi-fin multi-gate field effect transistor (i.e., a multi-fin MUGFET)

As mentioned above, the resistances associated with the source/drain regions of a field effect transistor (FET) are relatively large parasitic resistances that will impact performance. Thus, during FET design, accurate modeling of the total parasitic resistances of the source/drain regions is very important. Various techniques are well known in the art for modeling the total parasitic resistances of the source/drain regions of conventional planar FETs.

Recently, however, multi-gate non-planar field effect transistors (MUGFETs) (e.g., dual-gate non-planar FETs, also referred to herein as fin-type FETs (FINFETs), and tri-gate non-planar FETs) and, particularly, multi-fin MUGFETs have been developed to provide reduced-size field effect transistors, while simultaneously providing enhanced control in short channel effects (SCE) and reducing drain induced barrier lowering (DIBL). Specifically, dual-gate non-planar FETs are non-planar FETs formed using a relatively thin semiconductor fin. In such a FET, a fully depleted channel region is formed in the center portion of the thin semiconductor fin and source and drain regions are formed in the end portions of the semiconductor fin on opposing sides of the channel region. A gate is formed on the top surface and opposing sides of the semiconductor fin adjacent to the channel region. A dielectric cap (e.g., a nitride cap) is positioned on the top surface of the semiconductor fin (i.e., between the top surface of the fin and the gate) and ensures that the FET exhibits only two-dimensional field effects. Tri-gate non-planar FETs are similar in structure to the dual-gate non-planar FETS, described above, except that the top surface of the gate also contributes to the control of the current flow in the semiconductor fin of a tri-gate non-planar FET. In this case, the top surface of the semiconductor fin is not isolated from the gate by a dielectric cap and, thus, the FET exhibits three-dimensional field effects. The three-dimensional field effects allow for full depletion of the channel region despite the relatively thick semiconductor fin. It should be noted that the effective channel width of any of the above-described MUGFETs (e.g., of dual-gate and tri-gate non-planar FETs) and, thereby the device drive current can further be increased by incorporating multiple semiconductor fins into the MUGFET structure. Unfortunately, for such MUGFETs, the prior art diffusion region resistance modeling techniques do not provide accurate results without dramatically increasing simulation time. Therefore, there is a need in the art for technique that can be used to more accurately model diffusion region resistance of multi-fin MUGFETs with a much smaller transistor network.

In view of the foregoing, disclosed herein are embodiments of a method, system and program storage device for accurately modeling the total parasitic resistances of the source/drain regions of a multi-fin multi-gate field effect transistor (i.e., a multi-fin MUGFET). Specifically, in the embodiments, a full resistive network is first constructed for a multi-fin MUGFET design and, using this full resistive network, various resistance contributions to the total parasitic resistance associated with the diffusion region of the MUGFET are determined. These resistance contributions include the following: a first resistance contribution of end portions of the semiconductor fins, which are connected in pseudo-parallel by a local interconnect; second resistance contributions of segments of the local interconnect, which are connected in pseudo-series; and any other resistance contributions of any other resistive elements, which are within the resistive network between the end portions of the semiconductor fins and a single resistive element through which all the diffusion region current flows. It should be noted that each second resistance contribution of each segment of the local interconnect is particularly determined based on a quantized fractional current amount flowing through that segment given the relative positions, within the resistive network, of contact(s) on the local interconnect, of the segment within the local interconnect and of other segments within the local interconnect. Then, the multi-fin MUGFET can be represented in a netlist (e.g., a Simulation Program with Integrated Circuit Emphasis (SPICE) netlist) as a simple field effect transistor with the total parasitic resistances represented as single resistive elements connected to the source/drain nodes of the simple field effect transistor. This simplified netlist can then be used to simulate performance of the multi-fin MUGFET.

More particularly, referring to the flow diagram of FIG. 1, disclosed herein are embodiments of a computer-implemented method for accurately modeling the total parasitic resistances of the source/drain regions of a multi-fin multi-gate field effect transistor (i.e., a multi-fin MUGFET), such as a multi-fin dual-gate FET or multi-fin tri-gate FET.

Figure 2:
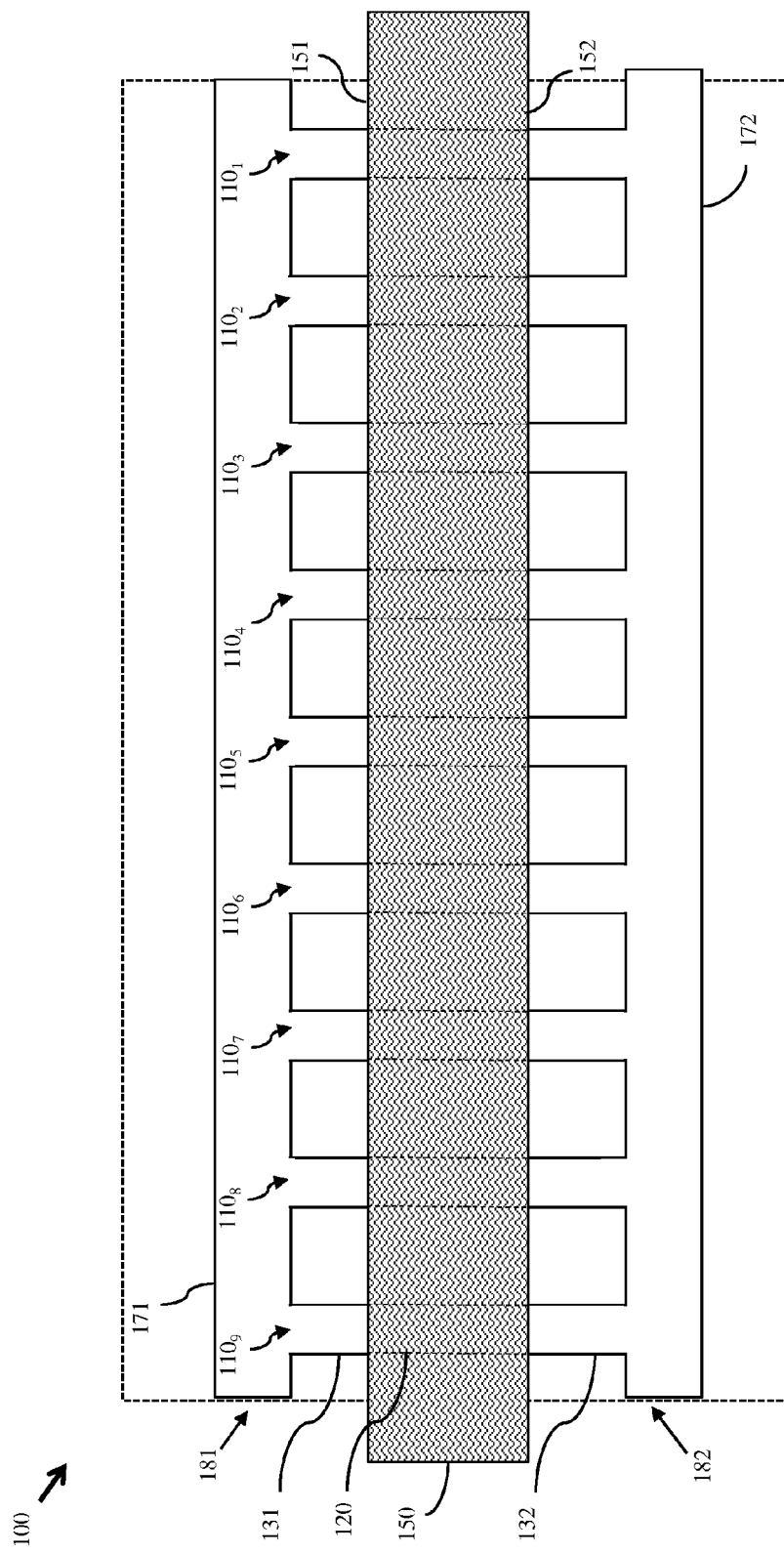
FIG. 2 is a top view diagram illustrating an exemplary multi-fin MUGFET.
Figure 3:
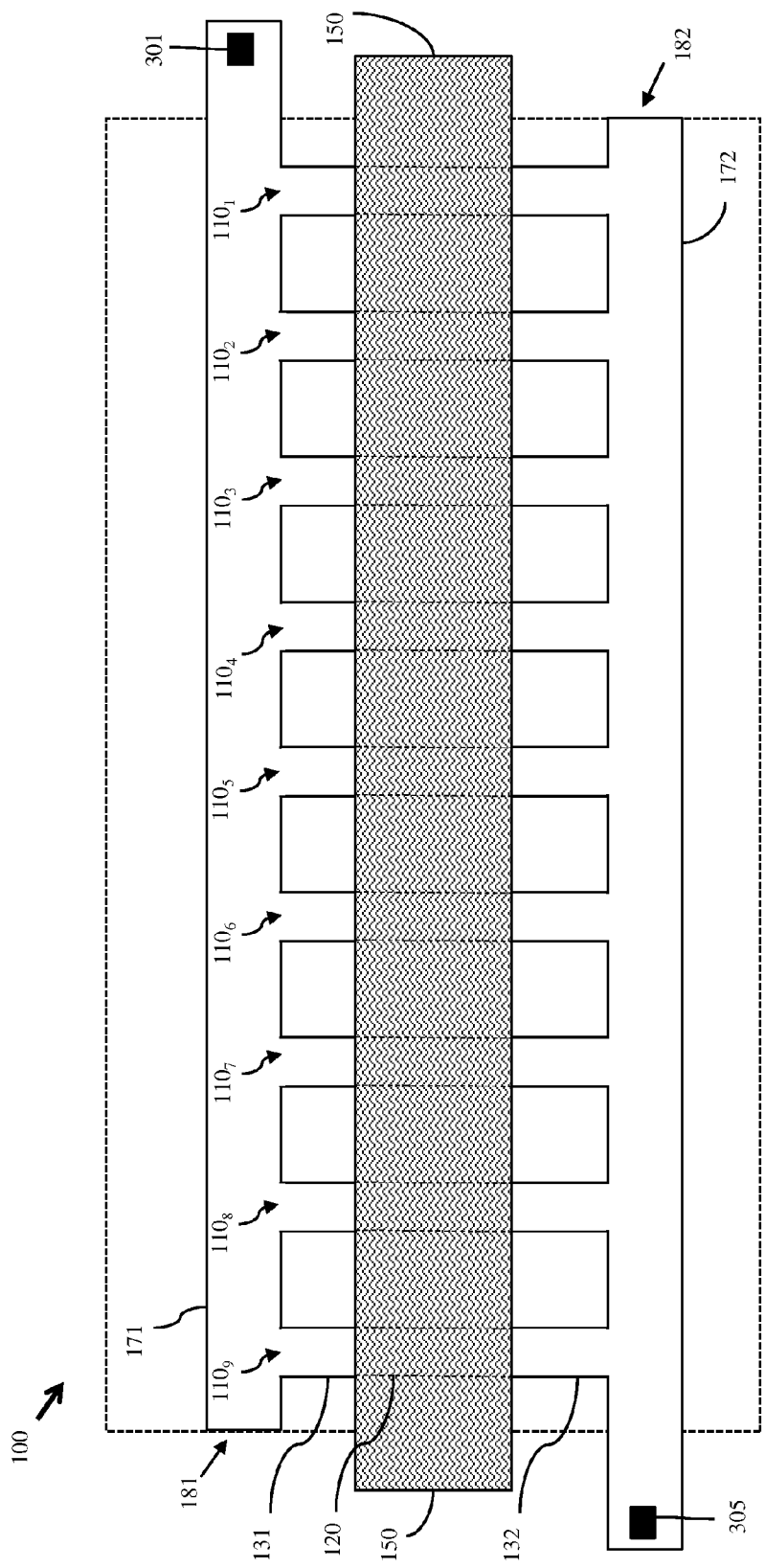
FIG. 3 is a top view diagram illustrating an exemplary multi-fin MUGFET with a local interconnect contacted by a single contact landing at one end.

In these method embodiments, a multi-fin MUGFET design, which is stored in memory, can be accessed (2). As illustrated in FIG. 2, an exemplary multi-fin MUGFET 100 can comprise a plurality of essentially parallel semiconductor fins $110_{1-9}$. For purposes of this disclosure, a semiconductor fin refers to a relatively thin, vertically oriented, essentially rectangular, three-dimensional semiconductor body, which is patterned and etched, for example, from a semiconductor layer of a semiconductor-on-insulator (SOI) wafer. Those skilled in the art will recognize that when the multi-fin MUGFET 100 comprises a dual-gate FET (as opposed to a tri-gate FET), each of the semiconductor fins $110_{1-9}$ can be capped with a dielectric cap (not shown) (e.g., a silicon nitride cap, a silicon oxide cap, a silicon oxynitride cap or any other suitable dielectric cap). Additionally, it should be noted that, for purposes of illustration the multi-fin MUGFET 100 is shown in FIG. 2 as having nine semiconductor fins; however, it should be understood that such a multi-fin MUGFET 100 can have any number of two or more semiconductor fins.

Each of the semiconductor fins $110_{1-9}$ can have a center portion 120, which comprises a channel region, positioned laterally between a first end portion 131 and a second end portion 132.

A gate structure 150 can traverse the center portions 120 (i.e., the channel regions) of the semiconductor fins $110_{1-9}$ such that the end portions 131, 132 of the semiconductor fins $110_{1-9}$ extend laterally beyond the gate structure 150. The gate structure 150 can, for example, comprise a conformal gate dielectric layer (e.g., a relatively thin silicon dioxide ($SiO_2$) layer, silicon nitride (SiN) layer, silicon oxynitride (SiON) layer, high-k dielectric layer, or any other suitable gate dielectric layer), which conformally covers the center portions 120 of the fins $110_{1-9}$. The gate structure 150 can further comprise a gate conductor layer (e.g., a doped polysilicon layer, a metal layer or any other suitable gate conductor layer) stacked above the conformal dielectric layer. Such gate structures are well known in the art and, thus, the details thereof are omitted from this specification in order to allow the reader to focus on the salient aspects of the embodiments.

The first end portions 131 of adjacent fins $110_{1-9}$ on a first side 151 of the gate structure 150 can be electrically connected to each other by a first local interconnect 171 (also referred to herein as a first contact region) to form, in combination, a first source/drain region 181 and the second end portions 132 of adjacent fins $110_{1-9}$ on a second side 152 of the gate structure 150 can be electrically connected to each other by a second local interconnect 172 (also referred to herein as a second contact region) to form, in combination, a second source/drain region 182. These local interconnects 171, 172 can be essentially perpendicular to and can abut the first end portions 131 and second end portions 132, respectively, of the semiconductor fins $110_{1-9}$. Such local interconnects are well known in the art and, thus, the details thereof are omitted from this specification in order to allow the reader to focus on the salient aspects of the embodiments.

However, those skilled in the art will recognize that, depending upon the design of the multi-fin MUGFET 100, the local interconnects 171, 172 can have varying different configurations. For example, they can be patterned and etched into the SOI wafer at essentially the same time as the semiconductor fins $110_{1-9}$ so as to form a discrete essentially ladder-shaped structure similar to the essentially ladder-shaped structure formed during multi-fin MUGFET processing as shown in U.S. Pat. No. 7,888,750 of Anderson et al., issued on Feb. 15, 2011, assigned to International Business Machines Corporation and incorporated herein by reference. Alternatively, the local interconnects 171, 172 can comprise regions wherein the end portions 131, 132 of the semiconductor fins $110_{1-9}$ are electrically connected by additional conductive materials. For example, they can be electrically connected by a conductive strap (e.g., a metal strap) similar to that used to electrically connect fins during multi-fin MUGFET processing as illustrated in U.S. Pat. No. 7,851,283 of Anderson et al., issued on Dec. 14, 2010, assigned to International Business Machines Corporation and incorporated herein by reference. Alternatively, they can be electrically connected by epitaxial semiconductor material, which is grown on vertical surfaces of the end portions 131, 132 of the semiconductor fins $110_{1-9}$ so as to merge the end portions 131, 132, which is doped so as to have the same conductivity type as the end portions 131, 132 and, which is similar to that used to electrically connect fins during multi-fin MUGFET processing in U.S. patent application Ser. No. 13/359,615 of Bryant et al., filed on Jan. 27, 2012, assigned to International Business Machines Corporation and incorporated herein by reference.

The first and second local interconnects 171, 172 are each contacted. Specifically, depending upon the design of the multi-fin MUGFET 100, the first and second local interconnects 171, 172 will be contacted by one or more contacts. For example, the first local interconnect 171 can be contacted by any of the following: a single contact 301 landing on one end of the first local interconnect 171 such that all of the fins $110_{1-9}$ are positioned on one side of the contact 301 (see FIG. 3); a single contact 401 aligned with one of the semiconductor fins, such as semiconductor fin $110_4$ (see FIG. 4); a single contact 501 positioned between two semiconductor fins, such as between adjacent semiconductor fins $110_3$ and $110_4$ (see FIG. 5); a pair of contacts 601, 602 (see FIG. 6); or any number of multiple contacts 701-704 (see FIG. 7). It should be noted that for illustration purposes the second local interconnect 172 is shown in FIGS. 3-7 as being contacted by a single contact 305 at one end of the second local interconnect 172 such that all of the fins $110_{1-9}$ are positioned on one side of the contact 305; however, it should be understood that, alternatively, the second local interconnect 172 can be contacted by one or more contacts positioned elsewhere on the second local interconnect 172, as described above and illustrated with respect to the first local interconnect 171.

Figure 8:
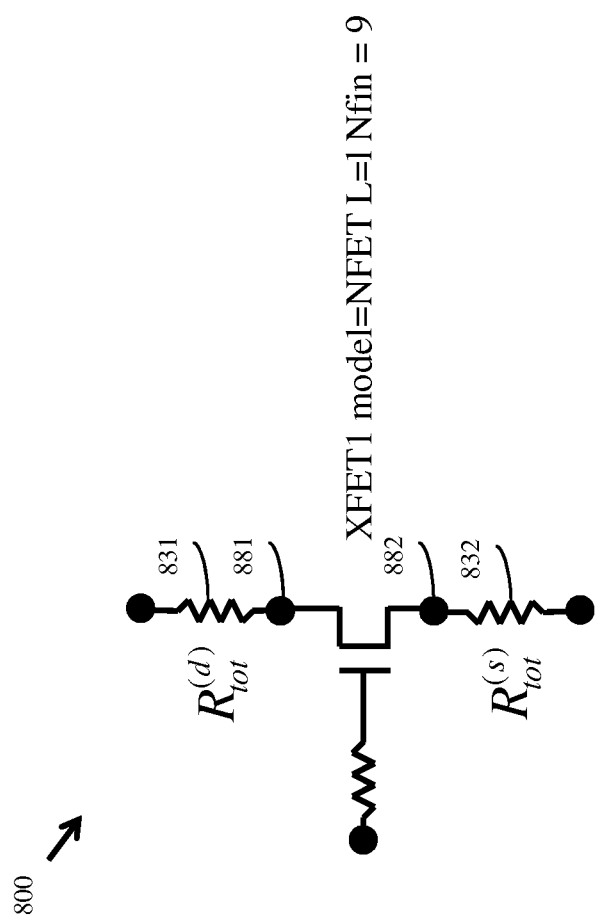
FIG. 8 is a schematic diagram illustrating an exemplary simple resistive network corresponding to a multi-fin multi-gate field effect transistor.

Referring again to FIG. 1 in combination with the multi-fin MUGFET design 100 shown in FIG. 2, a full resistive network for the MUGFET 100 design can be constructed so as to define the resistive elements in the source/drain regions 181, 182 of the multi-fin MUGFET 100 on opposite sides 151, 152 of the gate structure 150 (see process step 4 of FIG. 1). This full resistive network can then be used to determine various resistance contributions to the total parasitic resistances associated with the source/drain regions 181, 182 on the opposing sides 151, 152 of the gate structure 150 (see process step 6 of FIG. 1). The total parasitic resistances associated with the source/drain regions 181, 182 can then be calculated as the sum of the resistance contributions on their corresponding side 151, 152 of the gate structure 150 (see process step 8 of FIG. 1). Specifically, a first total parasitic resistance associated with the first source/drain region 181 on the first side 151 of the gate structure 150 can be determined and a second total parasitic resistance associated with the second source/drain region 182 on the second side 152 of the gate structure 150 can also be determined. Then, the multi-fin MUGFET 100 can be represented in a netlist (e.g., a Simulation Program with Integrated Circuit Emphasis (SPICE) netlist) as a simple field effect transistor 800 (i.e., a single field effect transistor having total drain current of multiple semiconductor fins), as shown in FIG. 8, with the total parasitic resistances of the source/drain regions ($R_{tot}^{(s)}$ and $R_{tot}^{(d)}$, see equations (1) and (2) discussed in detail below) represented as single resistive elements 831, 832 connected to the source/drain nodes 881, 882 of the simple field effect transistor 800 (see process steps 10-12 of FIG. 1). This simplified netlist can then be used to simulate performance of the multi-fin MUGFET (see process step 14 of FIG. 1).

For purposes of illustration, the processes 6 and 8 are described in detail below with respect to determining the first total parasitic resistance of the first source/drain region 181 ($R_{tot}^{(d)}$) on the first side 151 of the gate structure 150. However, it should be understood that the same processes could similarly be used for determining the second total parasitic resistance of the second source/drain region 182 ($R_{tot}^{(s)}$) on the second side 152 of the gate structure 150.

For determining the first total parasitic resistance of the first source/drain region 181 ($R_{tot}^{(d)}$) on the first side 151 of the gate structure 150 at process 8, the resistance contributions that are determined at process 6 using the full resistive network constructed at process 4 will include the following: a first resistance contribution of end portions 131 of the semiconductor fins $110_{1-9}$, which are connected in pseudo-parallel by a first local interconnect 171; second resistance contributions of segments of the first local interconnect 171, which are connected in pseudo-series; and any other resistance contributions of any other resistive elements, which are within the resistive network between the end portions 131 of the semiconductor fins $110_{1-9}$ and a single resistive element (i.e., a common resistive element) through which all the diffusion region current flows. For purposes of this disclosure, the phrase "connected in pseudo-parallel" refers to the fact that the semiconductor fins are not actually "connected in-parallel", instead local interconnect segments extend laterally between the semiconductor fins such that the semiconductor fins have the appearance of being "connected in-parallel". Similarly, for purposes of this disclosure, the phrase "connected in pseudo-series" refers the fact that the local interconnect segments are not strictly connected in series, since electric currents in interconnect segments are not identical. It should be noted that the full resistive network constructed at process 4 may become more complex depending upon the contact position on the first local interconnect 171, the number of contacts landing on the first local interconnect 171 and the level of separation between the end portions 131 of the semiconductor fins $110_{1-9}$ and the single resistive element (i.e., a common resistive element) through which all the diffusion region current flows. Thus, the number of resistance contributions may vary and the formulas by which they are determined at process 6 may also become more complex.

Figure 9:
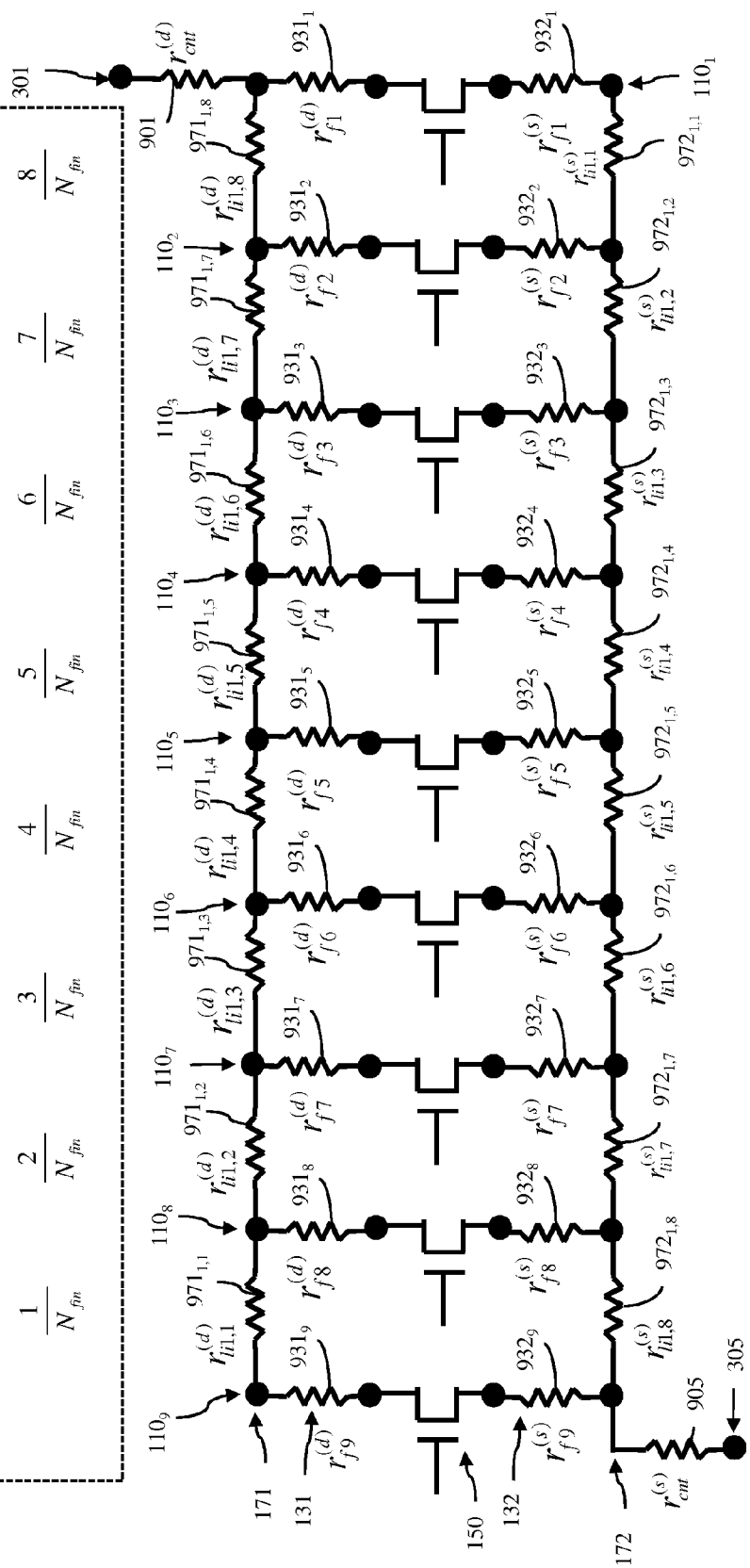
FIG. 9 is a schematic diagram illustrating a full resistive network corresponding to the multi-fin MUGFET of FIG. 3.

More specifically, as mentioned above, a single contact can extend vertically to the first local interconnect 171. For example, the first local interconnect 171 can be contacted by a single contact 301 landing on one end of the first local interconnect 171 such that all of the fins $110_{1-9}$ are positioned on one side of the contact 301 (see FIG. 3). FIG. 9 shows an exemplary full resistive network, which corresponds to the multi-fin MUGFET design of FIG. 3 and which can be generated at process 4. As shown, this full resistive network comprises the following: (1) resistive elements $931_1$-$931_9$ with resistance values $r_{f1}^{(d)}$-$r_{f9}^{(d)}$ corresponding to the end portions 131 of each of the fins $110_1$-$110_9$ on the first side of the gate structure 150; (2) resistive elements $971_{1,1}$-$971_{1,8}$ with resistance values $r_{li1,1}^{(d)}$-$r_{li1,8}^{(d)}$ corresponding to segments of the first local interconnect 171; (3) a resistive element 901 with a resistance value $r_{cnt}^{(d)}$ corresponding to the contact 301; (4) resistive elements $932_1$-$932_9$ with resistance values $r_{f1}^{(s)}$-$r_{f9}^{(s)}$ corresponding to the end portions 132 of each of the fins $110_1$-$110_9$ on the second side of the gate structure 150; (5) resistive elements $972_{1,1}$-$972_{1,8}$ having resistance values $r_{li1,1}^{(s)}$-$r_{li1,8}^{(s)}$ corresponding to segments of the second local interconnect 172; and (6) a resistive element 905 with a resistance value $r_{cnt}^{(s)}$ corresponding to the contact 305.

Figure 4:
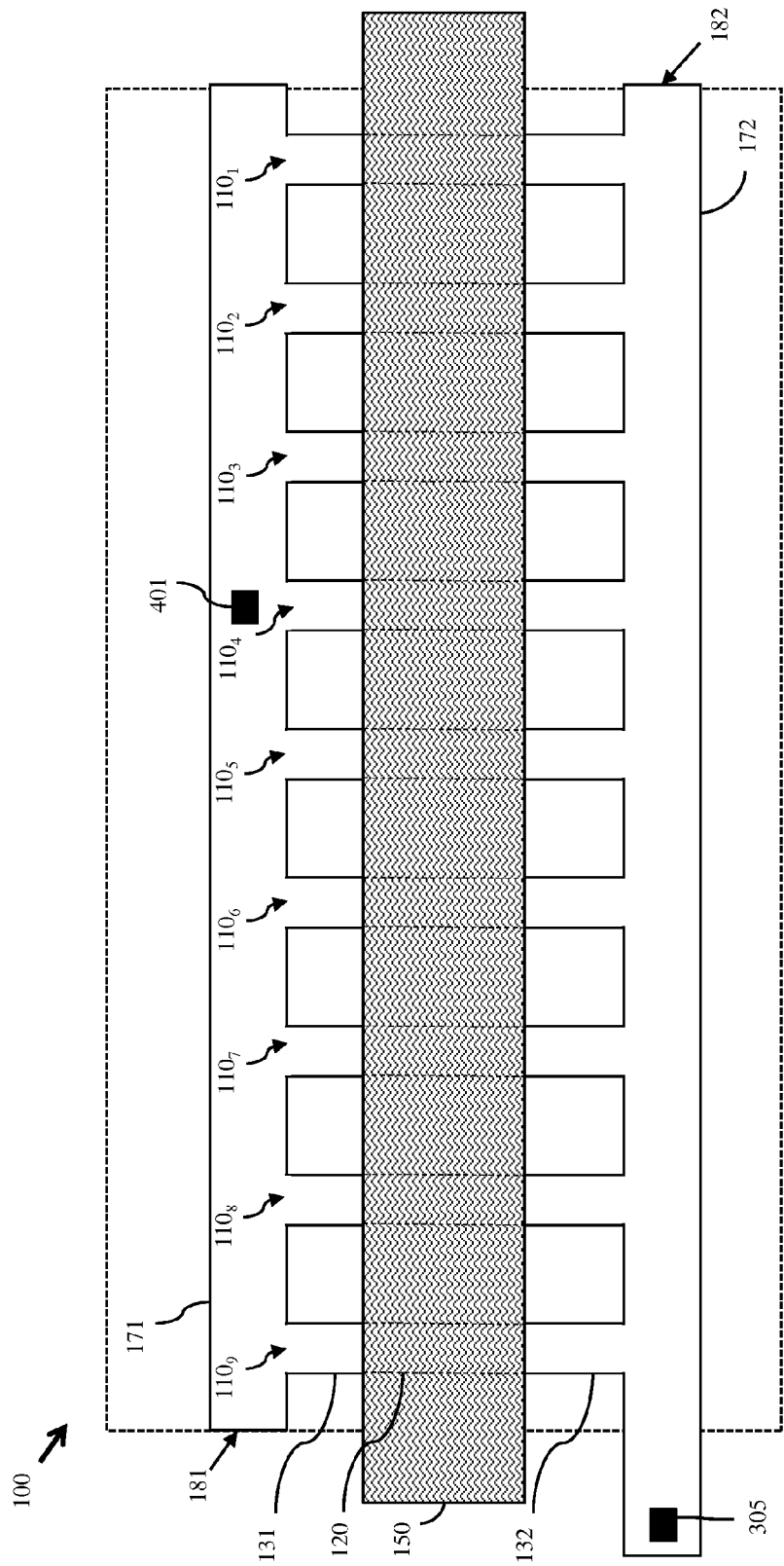
FIG. 4 is a top view diagram illustrating an exemplary multi-fin MUGFET with a local interconnect contacted by a single contact aligned with one of the semiconductor fins.
Figure 10:
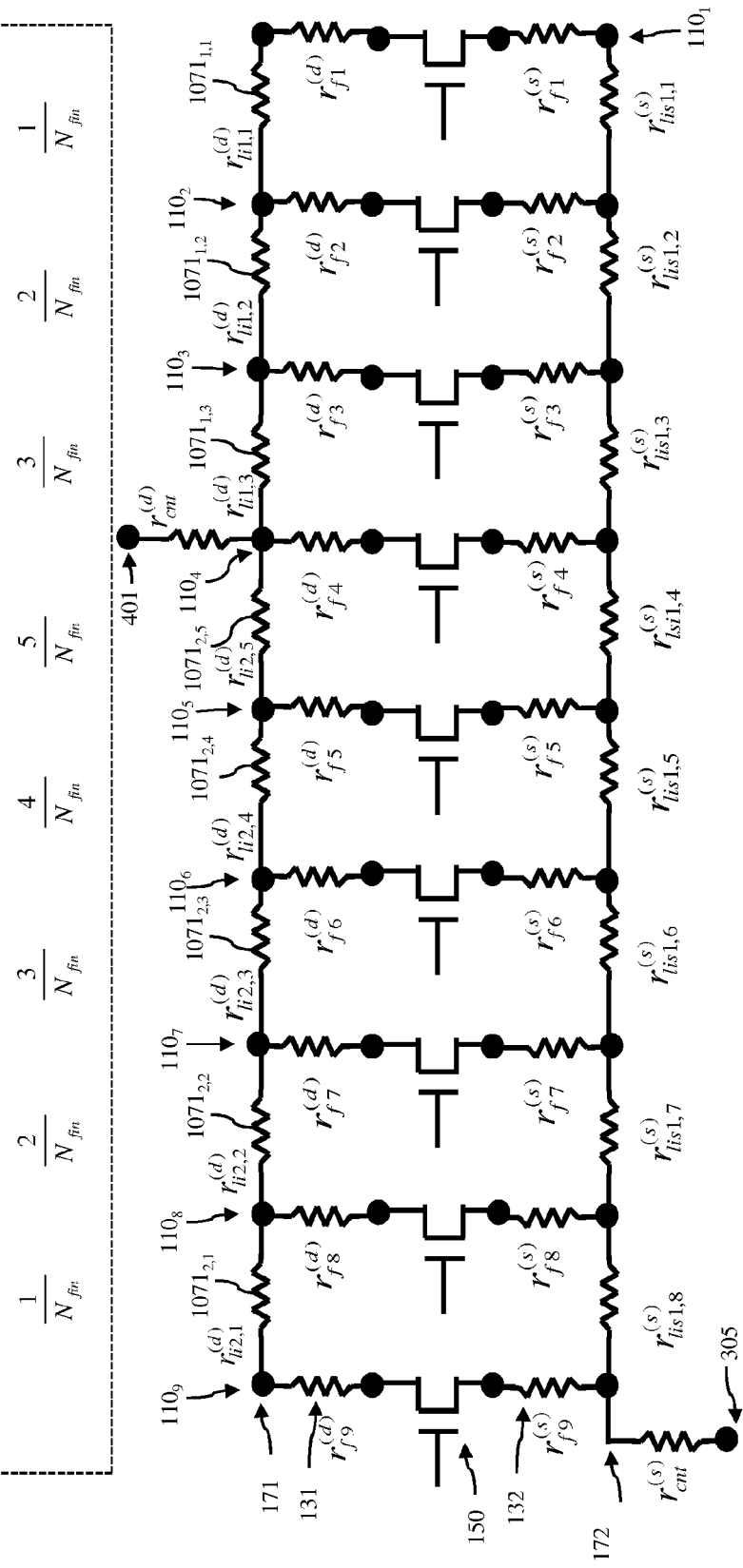
FIG. 10 is a schematic diagram illustrating a full resistive network corresponding to the multi-fin MUGFET of FIG. 4.

Alternatively, the first local interconnect 171 can be contacted by a single contact 401 aligned with one of the semiconductor fins, such as semiconductor fin $110_4$ (see FIG. 4). FIG. 10 shows an exemplary full resistive network, which corresponds to the multi-fin MUGFET design of FIG. 4 and which can be generated at process 4. As shown in FIG. 10, this full resistive network is similar to the full resistive network of FIG. 9 except with regards to the resistive elements in the first local interconnect 171. Specifically, this full resistive network comprises the following: (1) resistive elements with resistance values $r_{f1}^{(d)}$-$r_{f9}^{(d)}$ corresponding to the end portions 131 of each of the fins $110_1$-$110_9$ on the first side of the gate structure 150; (2) resistive elements $1071_{1,1}$-$1071_{1,3}$ with resistance values $r_{li1,1}^{(d)}$-$r_{li1,3}^{(d)}$ corresponding to segments of the first local interconnect 171 to the right of the contact 401 and resistive elements $1071_{2,1}$-$1071_{2,5}$ with resistance values $r_{li2,1}^{(d)}$-$r_{li2,5}^{(d)}$ corresponding to segments of the first local interconnect 171 to the left of the contact 401; (3) a resistive element with a resistance value $r_{cnt}^{(d)}$ corresponding to the contact 401; (4) resistive elements with resistance values $r_{f1}^{(s)}$-$r_{f9}^{(s)}$ corresponding to the end portions 132 of each of the fins $110_1$-$110_9$ on the second side of the gate structure 150; (5) resistive elements having resistance values $r_{li1,1}^{(s)}$-$r_{li1,8}^{(s)}$ corresponding to segments of the second local interconnect 172; and (6) a resistive element with a resistance value $r_{cnt}^{(s)}$ corresponding to the contact 305.

Figure 5:
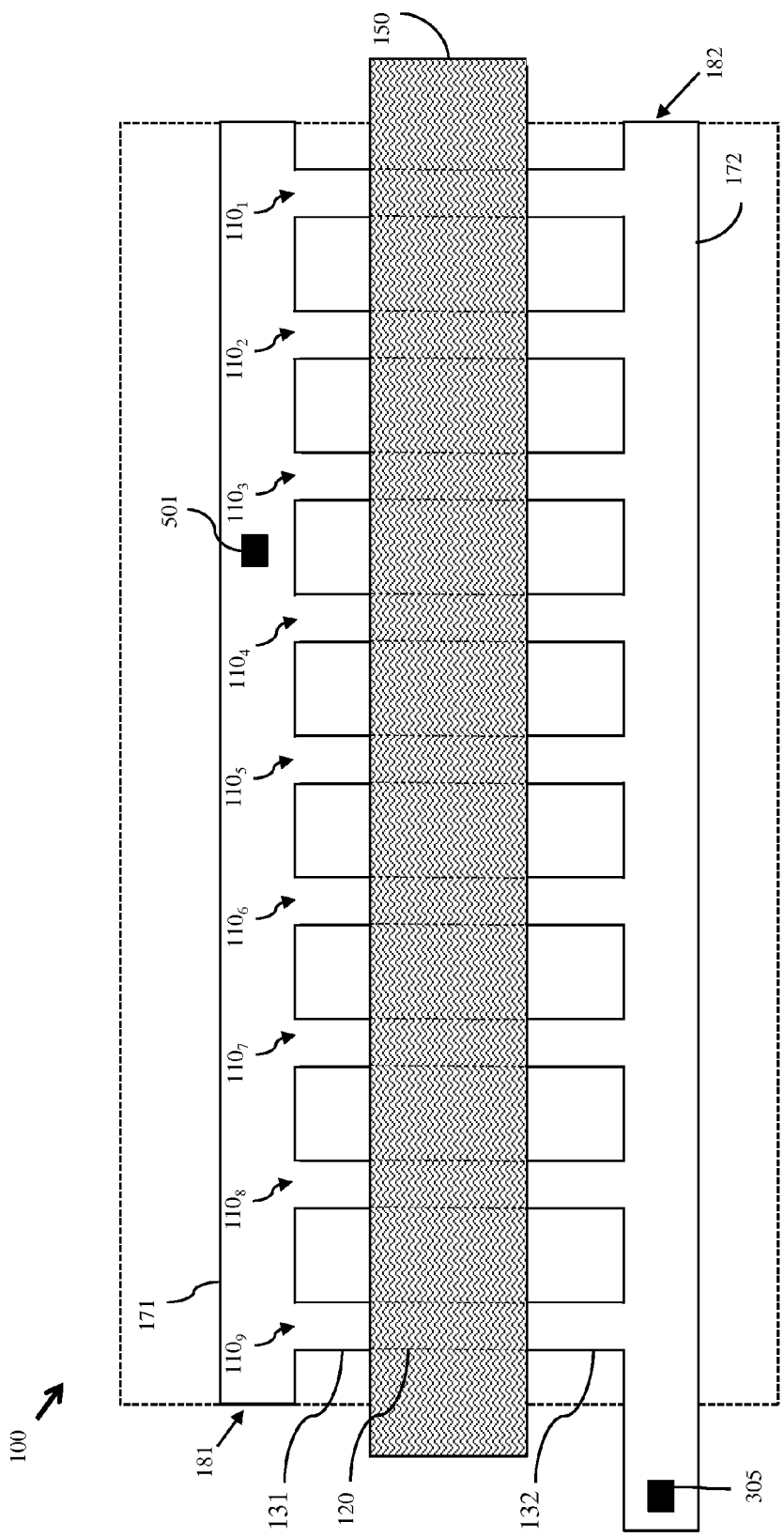
FIG. 5 is a top view diagram illustrating an exemplary multi-fin MUGFET with a local interconnect contacted by a single contact positioned between two semiconductor fins.
Figure 11:
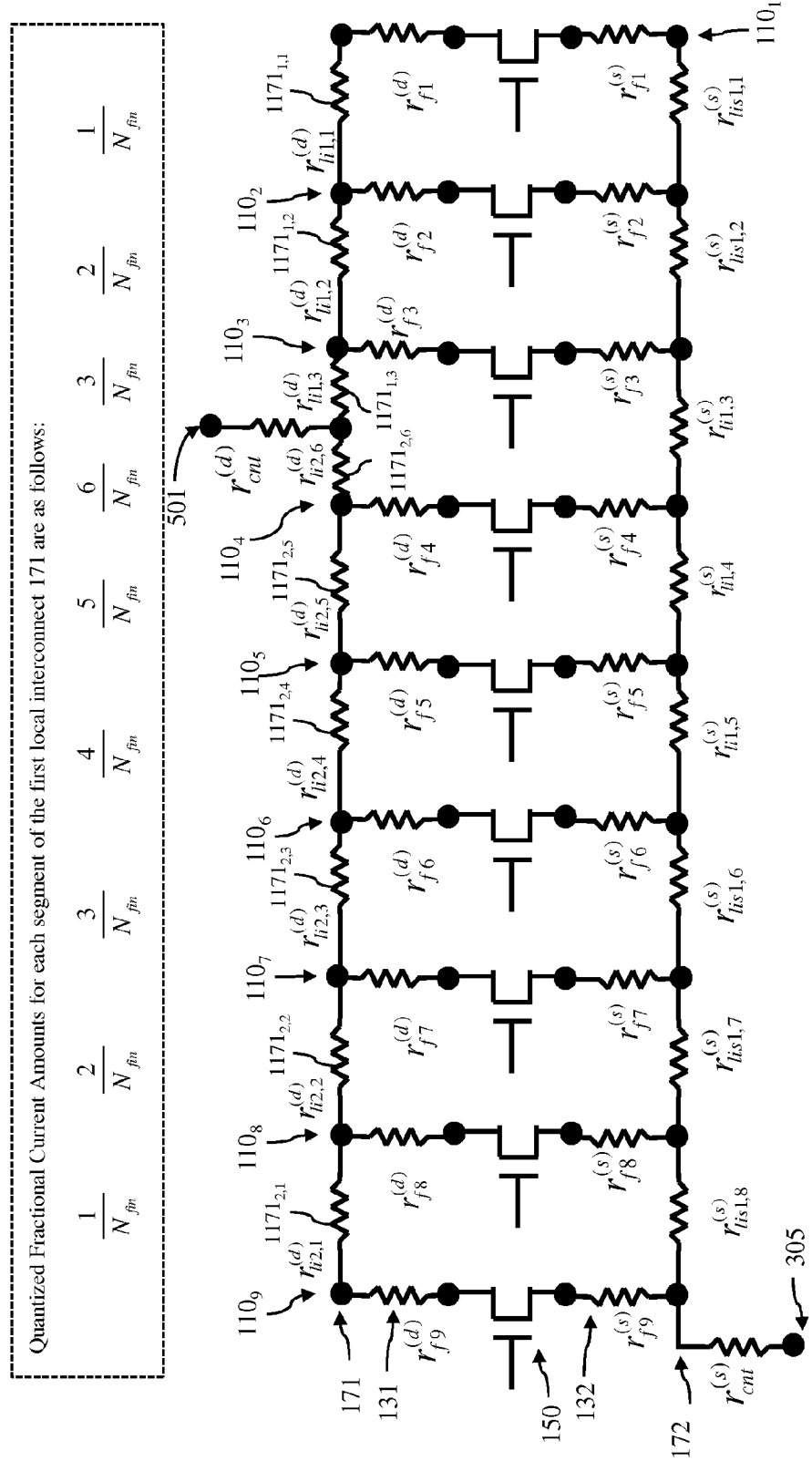
FIG. 11 is a schematic diagram illustrating a full resistive network corresponding to the multi-fin MUGFET of FIG. 5.

Alternatively, the first local interconnect 171 can be contacted by a single contact 501 positioned between two semiconductor fins, such as between fins $110_3$ and $110_4$ (see FIG. 5). FIG. 11 shows an exemplary resistive network, which corresponds to the multi-fin MUGFET design of FIG. 5 and which can be generated at process 104. As shown in FIG. 11, this full resistive network is similar to the full resistive network of FIG. 10 except with regards to the resistive elements in the first local interconnect 171. Specifically, this full resistive network comprises the following: (1) resistive elements with resistance values $r_{f1}{}^{(d)}$-$r_{f9}{}^{(d)}$ corresponding to the end portions 131 of each of the fins $110_1$-$110_9$ on the first side of the gate structure 150; (2) resistive elements $1171_{1,1}$-$1071_{1,3}$ having resistance values $r_{li1,1}{}^{(d)}$-$r_{li1,3}{}^{(d)}$ corresponding to segments of the first local interconnect 171 to the right of the contact 501 and resistive elements $1071_{2,1}$-$1071_{2,6}$ having resistance values $r_{li2,1}{}^{(d)}$-$r_{li2,6}{}^{(d)}$ corresponding to segments of the first local interconnect 171 to the left of the contact 501; (3) a resistive element with a resistance value $r_{cnt}{}^{(d)}$ corresponding to the contact 501; (4) resistive elements with resistance values $r_{f1}{}^{(s)}$-$r_{f9}{}^{(s)}$ corresponding to the end portions 132 of each of the fins $110_1$-$110_9$ on the second side of the gate structure 150; (5) resistive elements having resistance values $r_{li1,1}{}^{(s)}$-$r_{li1,8}{}^{(s)}$ corresponding to segments of the second local interconnect 172; and (6) a resistive element with a resistance value $r_{cnt}{}^{(s)}$ corresponding to the contact 305.

Figure 12:
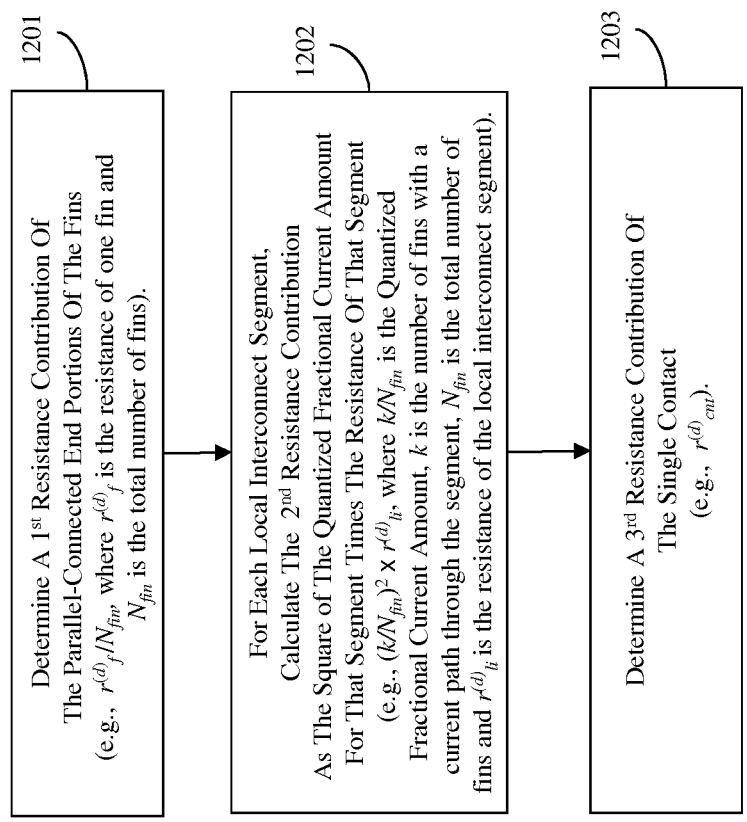
FIG. 12 is a flow diagram further detailing process 6 of FIG. 1 with respect to the multi-fin MUGFETS of FIGS. 3-5 in which the local interconnect is contacted by a single contact.

FIG. 12 is a flow diagram illustrating the detailed process steps that can be performed at process step 6 of FIG. 1 in order to determine the various resistance contributions to the total parasitic resistance of a source/drain region of a multi-fin MUGFET in cases where the local interconnect is contacted by a single contact. That is, the flow diagram of FIG. 12 can be used to determine, for example, the first total parasitic resistance of the first source/drain region 181 where the first local interconnect 171 is contacted by a single contact (e.g., 301 of FIG. 3, 401 of FIG. 4 or 501 of FIG. 5). As illustrated in the full resistive network diagrams of FIGS. 9-11, in such cases the single resistive element (i.e., the common resistive element) through which all the source/drain region current from the end portion 131 of each fin $110_{1-9}$ flows is the single contact to the first local interconnect 171. Thus, the following specific resistance contributions to the first total parasitic resistance $R_{tot}{}^{(d)}$ of the first source/drain region can be determined: a first resistance contribution of the resistive elements corresponding to the end portions 131 of the semiconductor fins $110_{1-9}$ (see fin resistances $r_f{}^{(d)}$) (1201), second resistance contributions of the restive elements corresponding to segments of the first local interconnect 171 (see first local interconnect segment resistances $r_{li}{}^{(d)}$) (1202), and a third resistance contribution of the resistive element corresponding to the single contact 301, 401 or 501 (see contact resistance $r_{cnt}{}^{(d)}$) (1203).

More specifically, at process 1201, a first resistance contribution of the resistive elements corresponding to the end portions 131 of the semiconductor fins $110_{1-9}$ can be determined. This first resistance contribution can take into consideration that the end portions 131 of the semiconductor fins $110_{1-9}$ are connected in pseudo-parallel to the first local interconnect 171. For example, when the end portions 131 of the semiconductor fins $110_{1-9}$ are essentially identical (i.e., when they comprise essentially identical resistive elements each having an essentially identical first resistance value $r_f{}^{(d)}$), which is typically the case, the first resistance contribution can be calculated as the first resistance value $r_f{}^{(d)}$ divided by the total number of semiconductor fins $N_{fin}$ (i.e., $r_f{}^{(d)}/N_{fin}$).

With regard to the second resistance contributions, series-connected segments of the local interconnect 171 are defined within the resistive network such that each segment extends laterally between an end portion of one semiconductor fin and either the single contact or an adjacent end portion of an adjacent semiconductor fin, whichever is closer. The number of local interconnect segments defined will depend upon the location of the contact on the local interconnect 171. For example, when the single contact 301 is at one end of the first local interconnect 171 (as shown in FIG. 9) or when the single contact 401 is aligned with one of the semiconductor fins, such as fin $110_4$ (as shown in FIG. 10), eight resistive element segments are defined within the first local interconnect 171 between each pair of adjacent fins (see the detailed discussion above defining the resistive elements in the first local interconnect 171 of FIGS. 9 and 10). However, as illustrated in FIG. 11, when a single contact 501 is positioned between two semiconductor fins, such as between fins $110_3$ and $110_4$, the portion of the local interconnect 171 between the two semiconductor fins will be divided into two segments. Thus, nine resistive element segments are defined: three to one side of the contact and six to the other (see the detailed discussion above regarding the resistive elements in the first local interconnect 171 of FIG. 11).

In any case, at process 1202, the second resistance contributions of the resistive element segments within the first local interconnect 171 (i.e., of the drain-side local interconnect segment resistances $r_{li}{}^{(d)}$) can be determined based on the relative positions of the single contact 301, 401, or 501 on the first local interconnect 171, of the corresponding segment within the first local interconnect 171 and of other segments within the first local interconnect 171. This is because the resistance contribution of each segment of the first local interconnect 171 is a function of the ratio of the amount of current that flows through that segment to the total amount of current that flow from the semiconductor fins to the single contact. The more current that flows through a given segment the greater the ratio.

For example, in the exemplary resistive network of FIG. 9, current from only a single semiconductor fin $110_9$ flows through the resistive element $971_{1,1}$ (i.e., the segment of the first local interconnect 171 farthest from the single contact 301), whereas current from eight semiconductor fins $110_{2-9}$ flows through the resistive element $971_{1,8}$ (i.e., the segment from the first local interconnect 171 closest to the contact 301). In the exemplary resistive network of FIG. 10, current from single semiconductor fins $110_9$ and $110_1$ flows through outermost resistive elements $1071_{1,1}$ and $1071_{2,1}$ (i.e., the outermost segments of the first local interconnect 171), whereas current from five semiconductor fins $110_9$-$110_5$ and three semiconductor fins $110_1$-$110_3$, respectively, flows through the resistive elements $1071_{2,5}$ and $1071_{1,3}$ (i.e., the segments of the first local interconnect 171 closest to the contact 401). In the exemplary resistive network of FIG. 11, current from single semiconductor fins $110_9$ and $110_1$ flows through outermost resistive elements $1171_{1,1}$ and $1171_{2,1}$ (i.e., the outermost segments of the first local interconnect 171), whereas current from six semiconductor fins $110_{9-4}$ and three semiconductor fins $110_{1-3}$, respectively, flows through the resistive elements $1171_{2,6}$ and $1171_{1,3}$ (i.e., the segments of the first local interconnect 171 closest to the contact 501).

Each second resistance contribution of each corresponding segment of the local interconnect 171 is equal to the product of the resistance associated with the corresponding segment (i.e., $r_{li}{}^{(d)}$) times the square of a quantized fractional current amount flowing through that corresponding segment. The quantized fractional current amount flowing through a segment is a function of where that segment is positioned within the local interconnect relative to the position of the contact on the local interconnect and the positions of the other segments within the local interconnect. Specifically, the quantized fractional current amount for each segment, as shown in FIGS. 9-11, is equal to the number k of the semiconductor fins $110_{1-9}$ with a current path through that segment divided by the total number of semiconductor fins $N_{fin}$ (i.e., $k/N_{fin}$). Consequently, as shown in the exemplary resistive network of FIG.

9, the quantized fractional current amount through the resistive element $971_{1,1}$ (i.e., the segment of the first local interconnect 171 farthest from the single contact 301) is $1/N_{fin}$, whereas the quantized fractional current amount through the resistive element $971_{1,8}$ (i.e., the segment from the first local interconnect 171 closest to the contact 301) is $8/N_{fin}$. In the exemplary resistive network of FIG. 10, the quantized fractional current amount through each of the outermost resistive elements $1071_{1,1}$ and $1071_{2,1}$ (i.e., the outermost segments of the first local interconnect 171) is $1/N_{fin}$, whereas the quantized fractional current amounts through the resistive elements $1171_{2,5}$ and $1171_{1,3}$ (i.e., the segments of the first local interconnect 171 closest to the contact 401) are $5/N_{fin}$ and $3/N_{fin}$, respectively. In the exemplary resistive network of FIG. 11, the quantized fractional current amount through each of the outermost resistive elements $1071_{1,1}$ and $1071_{2,1}$ (i.e., the outermost segments of the first local interconnect 171) is $1/N_{fin}$, whereas the quantized fractional current amounts through the resistive elements $1171_{2,6}$ and $1171_{1,3}$ (i.e., the segments of the first local interconnect 171 closest to the contact 501) are $6/N_{fin}$ and $3/N_{fin}$, respectively.

As mentioned above and referring again to the flow diagram of FIG. 1, after the appropriate resistance contributions have been determined at process 6, their sum can be calculated to determine the first total parasitic resistance $R_{tot}^{(d)}$ of the first source/drain region 181 at process 8. Specifically, in the case where the first local interconnect 171 is contacted by a single contact, $R_{tot}^{(d)}$ can be calculated by using the following formula:

$$R_{tot}^{(d)} = \frac{r_f^{(d)}}{N_{fin}} + \sum_{i=1}^{2} \sum_{k=1}^{m_i^{(d)}} \left(\frac{k}{N_{fin}}\right)^2 r_{li,i,k}^{(d)} + r_{cnt}^{(d)}, \quad (1)$$

where the $r_f^{(d)}/N_{fin}$ is the first resistance contribution of the resistive elements corresponding to the end portions 131 of the semiconductor fins $110_{1-9}$, which are connected in pseudo-parallel, where $$\sum_{i=1}^{2} \sum_{k=1}^{m_i^{(d)}} (k/N_{fin})^2 r_{li,i,k}^{(d)}$$

is the sum of the second contributions of the restive elements corresponding to segments of the first local interconnect 171, and where $R_{cnt}^{(d)}$ is a third resistance contribution of the resistive element corresponding to the single contact 301, 401 or 501.

It should be noted that the following equivalent formula can be applied to determine the total parasitic resistance of the source region on the opposite side of the gate structure 150:

$$R_{tot}^{(d)} = \frac{r_f^{(s)}}{N_{fin}} + \sum_{i=1}^{2} \sum_{k=1}^{m_i^{(s)}} \left(\frac{k}{N_{fin}}\right)^2 r_{li,i,k}^{(s)} + r_{cnt}^{(s)}. \quad (2)$$

It should further be noted that for cases, such as that shown in the exemplary resistive network of FIG. 9, where the contact 301 is at one end of the first local interconnect 171, and in the exemplary resistive network of FIG. 10, where the contact 401 is aligned with one of the semiconductor fins (e.g., semiconductor fin $110_4$) the formula for the total parasitic resistance of the drain region $R_{tot}^{(d)}$ can be simplified as follows:

$$R_{tot}^{(d)} = \frac{r_f^{(d)}}{N_{fin}} + \frac{r_{li}^{(d)}}{6N_{fin}^2} \sum_{i=1}^{2} m_i^{(d)}(m_i^{(d)} + 1)(2m_i^{(d)} + 1) + r_{cnt}^{(d)}, \quad (3)$$

where $m_1^{(d)} + m_2^{(d)} = N_{fin} - 1$, where $m_1^{(d)}$ indicates the number of segments to the right of the contact 401 (i.e., 3), and where $m_2^{(d)}$ indicates the number of segments to the left of the contact 401 (i.e., 5). It should be noted that this equation (3) takes advantage of the fact that, in a typical multi-fin MUGFET, the semiconductor fins are uniformly spaced (i.e., there is a uniform fin pitch). When the semiconductor fins are uniformly spaced, the resistance values associated with each of the segments of the first local interconnect 171 will have the same length and, thereby the same resistance value. For example, in FIG. 9, $r_{li1,1}^{(d)} = r_{li1,2}^{(d)} = r_{li1,3}^{(d)}$ and so on. In FIG. 10, $r_{li1,1}^{(d)} = r_{li1,2}^{(d)} = r_{li2,1}^{(d)} = r_{li2,2}^{(d)}$ and so on.

Additionally, for cases, such as that shown in the exemplary resistive network of FIG. 11, where the contact 501 is positioned between two adjacent semiconductor fins (e.g., between semiconductor fins $110_4$ and $110_3$) the equation for the total parasitic resistance of the drain region $R_{tot}^{(d)}$ can be simplified as follows:

$$R_{tot}^{(d)} = \frac{r_f^{(d)}}{N_{fin}} + \frac{r_{li}^{(d)}}{N_{fin}^2}[s(x^{(d)} - 1) + s(N_{fin} - x^{(d)})] + r_{cnt}^{(d)}, \quad (4a)$$

with $$s(x) = \frac{1}{6}k(k+1)(2k+1) + (x-k)(k+1)^2, k = \text{int}(k). \quad (4b)$$

It should be noted that this equation (4) takes advantage of the fact that in a typical multi-fin MUGFET the semiconductor fins are uniformly spaced (i.e., there is a uniform fin pitch). When the semiconductor fins are uniformly spaced, the resistance values associated with most of the segments of the first local interconnect 171 will have the same length and, thereby the same resistance value. For example, in FIG. 11, $r_{li1,1}^{(d)} = r_{li1,2}^{(d)} = r_{li2,1}^{(d)} = r_{li2,2}^{(d)} = r_{li2,3}^{(d)} = r_{li2,4}^{(d)} = r_{li2,5}^{(d)}$. Only $r_{li2,6}^{(d)}$ and $r_{li1,3}^{(d)}$ will have different resistance values because they correspond to the relatively short segments of the first local interconnect 171 closest to the contact 501, which is positioned between two semiconductor fins.

As mentioned above, the number of resistance contributions may increase and the manner in which they are determined may become more complex depending upon the number of contacts landing on the local interconnect and the level of separation between the end portions 131 of the semiconductor fins $110_{1-9}$ and the single resistive element (i.e., a common resistive element) through which all the diffusion region current flows.

Figure 6:
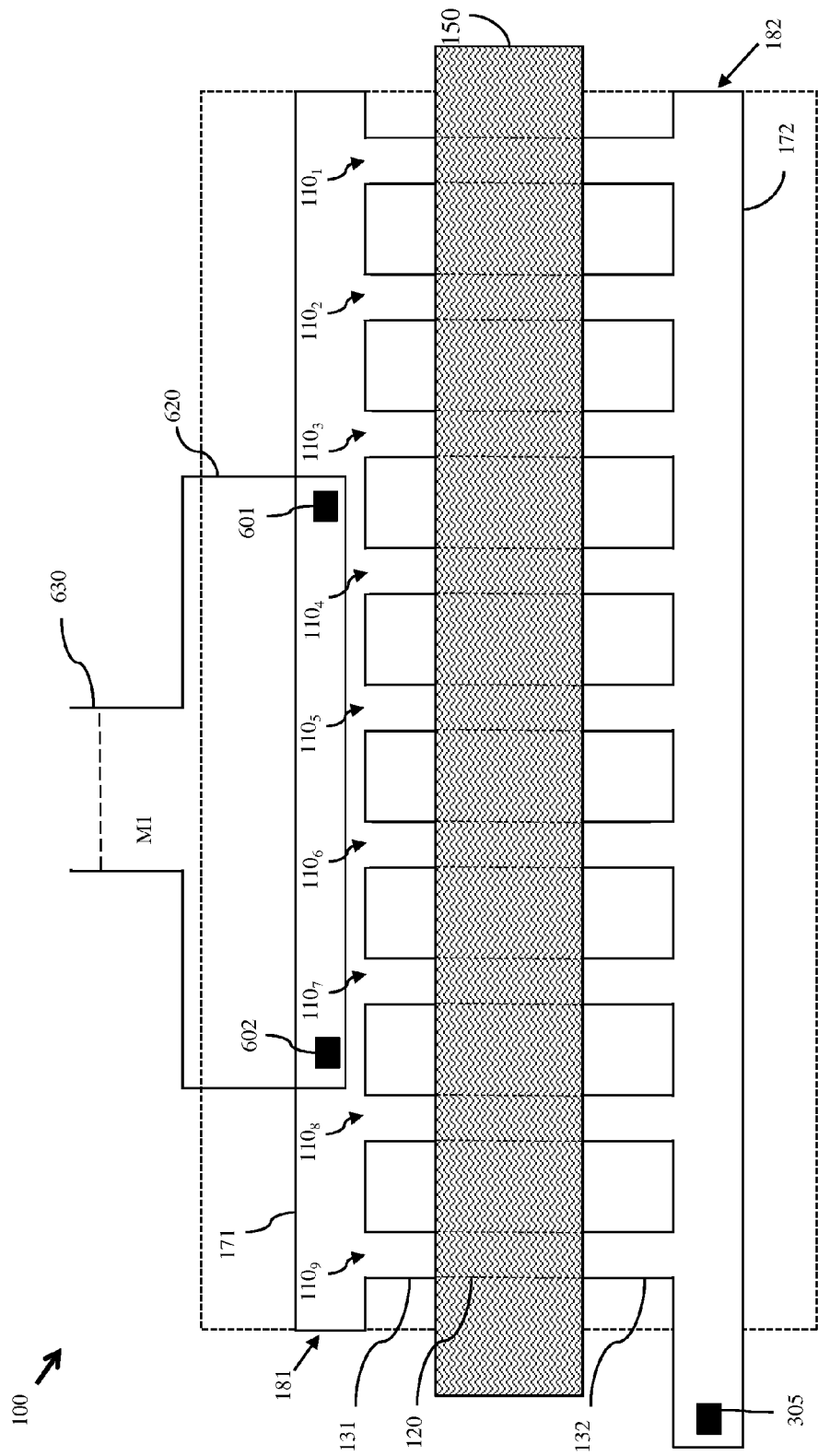
FIG. 6 is a top view diagram illustrating an exemplary multi-fin MUGFET with a local interconnect contacted by a pair of contacts.
Figure 13:
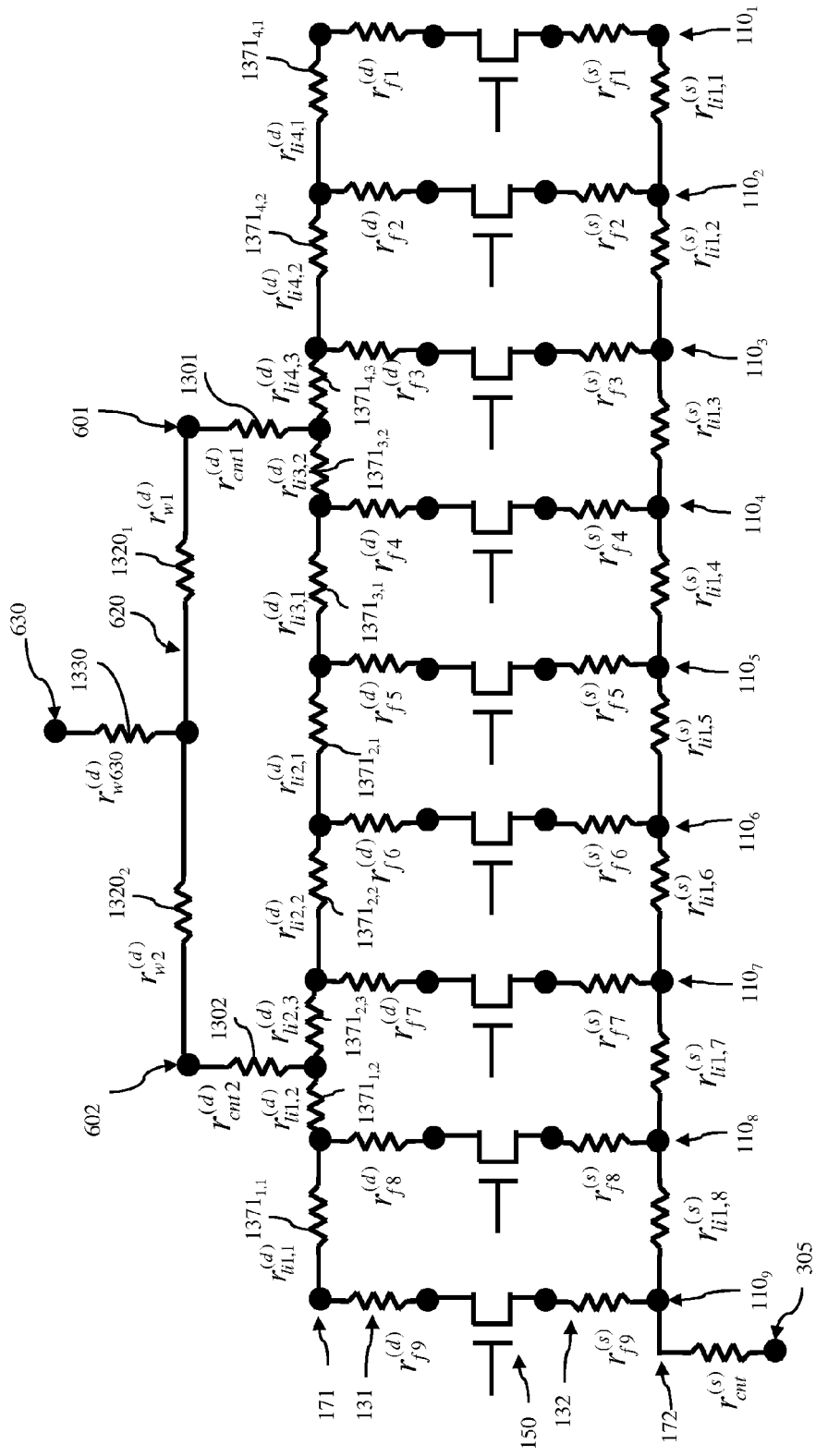
FIG. 13 is a schematic diagram illustrating a full resistive network corresponding to the multi-fin MUGFET of FIG. 6.

For example, FIG. 6 illustrates a multi-fin MUGFET design with a pair of contacts 601, 602 that extend vertically between the first local interconnect 171 and a wire 620 (e.g., in one of the metal layers Ml above the first local interconnect 171), which is in turn connected to a common node line 630, which is the single resistive element through which all the diffusion region current flows. FIG. 13 shows an exemplary resistive network, which corresponds to the multi-fin MUGFET design of FIG. 6 and which can be generated at process 4 of FIG. 1. As shown in FIG. 13, this full resistive network is similar to the full resistive network of FIG. 11 except with regards to the resistive elements in the first local interconnect 171 and the additional resistive elements of the multiple contacts 601, 602, the wire 620 and the common node line 630. Specifically, this full resistive network comprises the following: (1) resistive elements with resistance values $r_{f1}^{(d)}$-$r_{f9}^{(d)}$ corresponding to the end portions 131 of each of the fins $110_1$-$110_9$ on the first side of the gate structure 150; (2) resistive elements $1371_{1,1}$-$1371_{1,2}$ having resistance values $r_{li2,1}^{(d)}$-$r_{li2,3}^{(d)}$ corresponding to segments of the first local interconnect 171 to the left of the contact 602, resistive elements $1371_{2,1}$-$1371_{2,3}$ having resistance values $r_{li2,1}^{(d)}$-$r_{li2,3}^{(d)}$ corresponding to segments of the first local interconnect 171 to the right of the contact 602, resistive elements $1371_{3,1}$-$1371_{3,2}$ having resistance values $r_{li3,1}^{(d)}$-$r_{li3,2}^{(d)}$ corresponding to segments of the first local interconnect 171 to the left of the contact 601, and resistive elements $1371_{4,3}$-$1371_{4,1}$ having resistance values $r_{li4,3}^{(d)}$-$r_{li4,1}^{(d)}$ corresponding to segments of the first local interconnect 171 to the right of the contact 601; (3) a resistive element 1301 with a resistance value $r_{cnt1}^{(d)}$ corresponding to the contact 601 and a resistive element 1302 with a resistance value $r_{cnt2}^{(d)}$ corresponding to the contact 602; (4) a resistive element $1320_1$ with a resistance value $r_{w1}^{(d)}$ corresponding to the segment of wire 620 to the right of the common node line 630 and a resistive element $1320_2$ with a resistance value $r_{w2}^{(d)}$ corresponding to the segment of the wire 620 to the left of the common node line 630; (5) a resistive element 1330 with a resistance value $r_{w630}^{(d)}$ corresponding to the common node line 630; (6) resistive elements with resistance values $r_{f1}^{(s)}$-$r_{f9}^{(s)}$ corresponding to the end portions 132 of each of the fins $110_1$-$110_9$ on the second side of the gate structure 150; (7) resistive elements having resistance values $r_{li1,1}^{(s)}$-$r_{li1,8}^{(s)}$ corresponding to segments of the second local interconnect 172; and (8) a resistive element with a resistance value $r_{cnt}^{(s)}$ corresponding to the contact 305.

Figure 7:
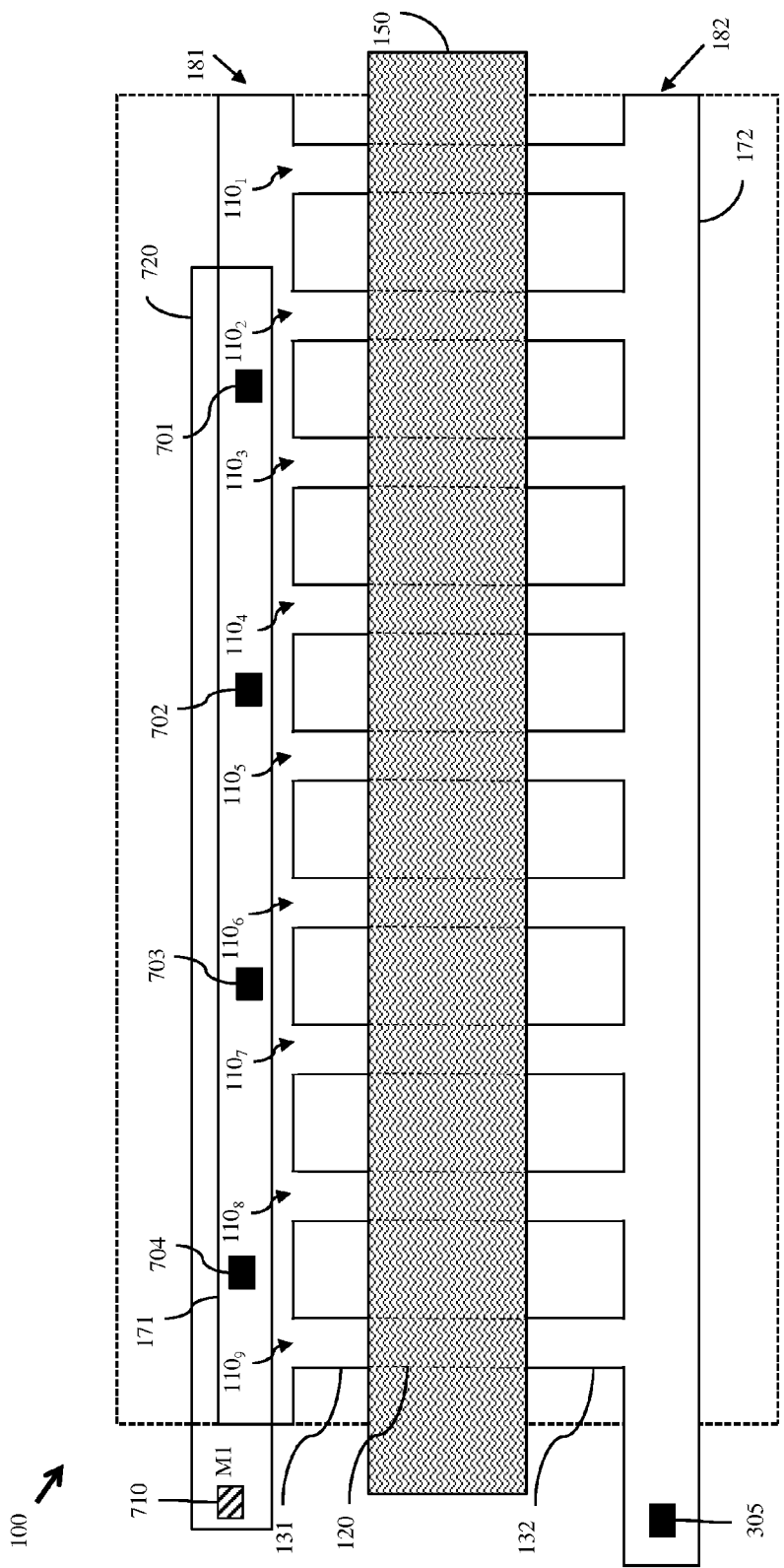
FIG. 7 is a top view diagram illustrating an exemplary multi-fin MUGFET with a local interconnect contacted by multiple contacts.
Figure 14:
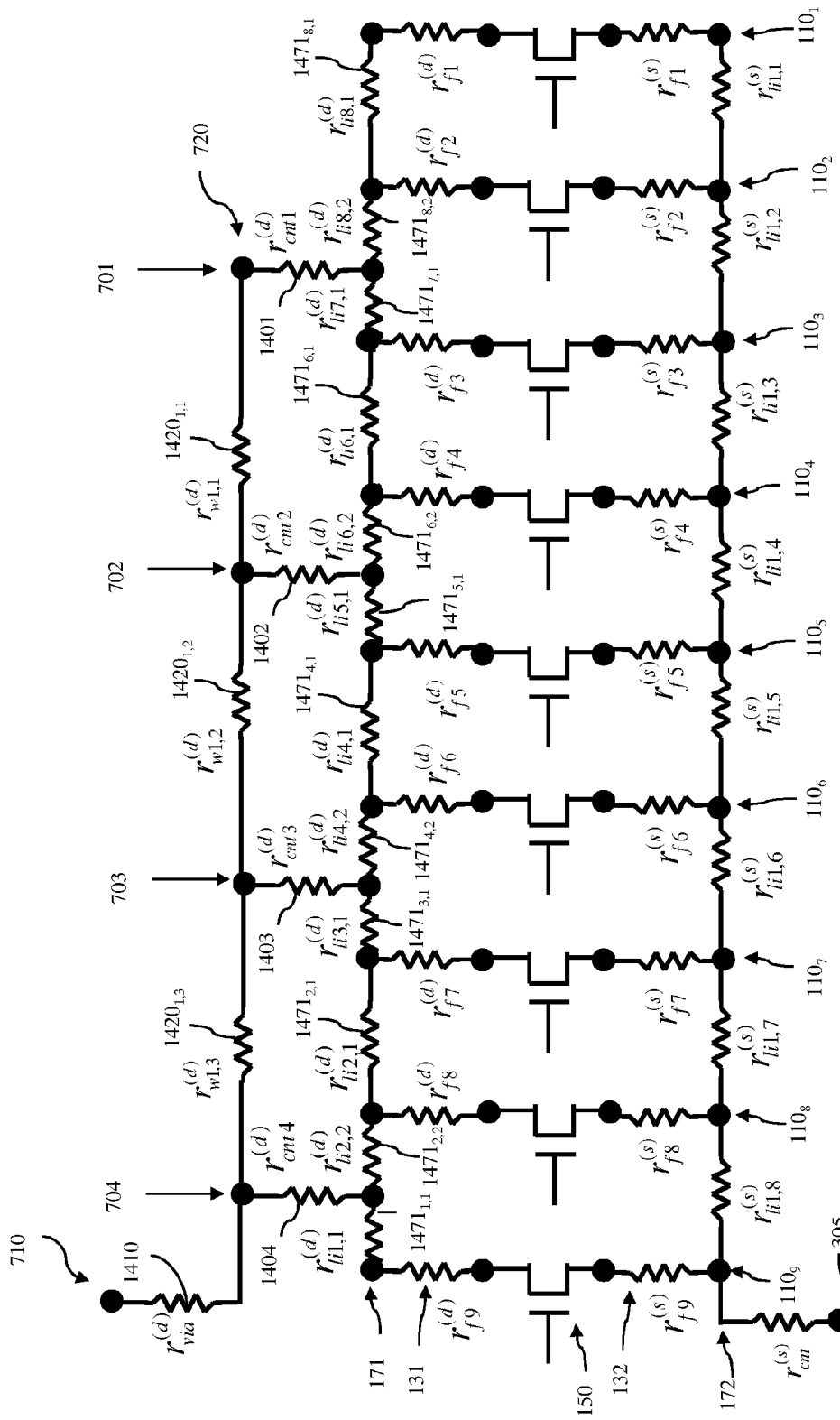
FIG. 14 is a schematic diagram illustrating a full resistive network corresponding to the multi-fin MUGFET of FIG. 7.

FIG. 7 illustrates an even more complex multi-fin MUGFET design with more than two contacts 701-704 that extend vertically between the first local interconnect 171 and a wire 720 (e.g., in one of the metal layers above the first local interconnect 171). In this case, a via 710 is the single resistive element through which all the diffusion region current flows and this via 710 extends vertically to one end of the wire 720 such that contacts 701-704 are separated from this via 710 by varying distances. FIG. 14 shows an exemplary resistive network, which corresponds to the multi-fin MUGFET design of FIG. 7 and which can be generated at process 4 of FIG. 1. As shown in FIG. 14, this full resistive network is similar to the full resistive network of FIG. 13 except with regards to the resistive elements in the first local interconnect 171 and the additional resistive elements of the multiple contacts 701-704, the wire 720 and the via 710. Specifically, this full resistive network comprises the following: (1) resistive elements with resistance values $r_{f1}^{(d)}$-$r_{f9}^{(d)}$ corresponding to the end portions 131 of each of the fins $110_1$-$110_9$ on the first side of the gate structure 150; (2) resistive element $1471_{1,1}$ having a resistance value $r_{li1,1}^{(d)}$ corresponding to segment of the first local interconnect 171 to the left of the contact 704, resistive elements $1471_{2,1}$-$1471_{2,2}$ having resistance values $r_{li2,1}^{(d)}$-$r_{li2,2}^{(d)}$ corresponding to segments of the first local interconnect 171 to the right of the contact 704, resistive element $1471_{3,1}$ having a resistance value $r_{li3,1}^{(d)}$ corresponding to the segment of the first local interconnect 171 to the left of the contact 703, resistive elements $1471_{4,2}$-$1471_{4,1}$ having resistance values $r_{li4,2}^{(d)}$-$r_{li4,1}^{(d)}$ corresponding to segments of the first local interconnect 171 to the right of the contact 703, resistive element $1471_{5,1}$ having a resistance value $r_{li5,1}^{(d)}$ corresponding to the segment of the first local interconnect 171 to the left of the contact 702, resistive elements $1471_{6,1}$-$1471_{6,2}$ having resistance values $r_{li6,1}^{(d)}$-$r_{li6,2}^{(d)}$ corresponding to segments of the first local interconnect 171 to the right of the contact 702, resistive element $1471_{7,1}$ having a resistance value $r_{li7,1}^{(d)}$ corresponding to the segment of the first local interconnect 171 to the left of the contact 701, and resistive elements $1471_{8,2}$-$1471_{8,1}$ having resistance values $r_{li8,2}^{(d)}$-$r_{li8,1}^{(d)}$ corresponding to segments of the first local interconnect 171 to the right of the contact 701; (3) resistive elements 1401-1404 with resistance values $r_{cnt1}^{(d)}$-$r_{cnt4}^{(d)}$ corresponding to the contacts 701-704, respectively; (4) resistive elements $1420_{1,1}$, $1420_{1,2}$ and $1420_{1,2}$ with resistance values $r_{w1,1}^{(d)}$, $r_{w1,2}^{(d)}$, and $r_{w1,3}^{(d)}$ corresponding to the segments of wire 720 to the right of the via 1410; (5) a resistive element 1410 with a resistance value $r_{via}^{(d)}$ corresponding to the via 710; (6) resistive elements with resistance values $r_{f1}^{(s)}$-$r_{f9}^{(s)}$ corresponding to the end portions 132 of each of the fins $110_1$-$110_9$ on the second side of the gate structure 150; (7) resistive elements having resistance values $r_{li1,1}^{(s)}$-$r_{li1,8}^{(s)}$ corresponding to segments of the second local interconnect 172; and (8) a resistive element with a resistance value $r_{cnt}^{(s)}$ corresponding to the contact 305.

In these cases, where multiple contacts extend vertically between a wire and the first local interconnect 171, the first total parasitic resistance of the first source/drain region $R_{tot}^{(d)}$ can be calculated as the sum of the first resistance contribution of the resistive elements corresponding to the end portions 131 of the semiconductor fins $110_{1-9}$ (see fin resistances $r_f^{(d)}$), second resistance contributions of the restive elements corresponding to segments of the first local interconnect 171 (see first local interconnect segment resistances $r_{li}^{(d)}$), a third resistance contribution of the resistive elements corresponding to the multiple contacts (see contact resistances $r_{cnt}^{(d)}$), and a fourth resistance contribution of the resistive elements corresponding to the multiple wire segments (see drain-side wire resistance $r_w^{(d)}$). In general, one needs to include all parasitic resistance elements until the single resistive element through which all diffusion region current flows is reached (e.g., see the wire and common node line resistances $r_w^{(d)}$ and $r_{cnt}^{(d)}$ in FIG. 13 or the wire and via resistances $r_w^{(d)}$ and $r_{via}^{(d)}$ in FIG. 14).

Figure 15:
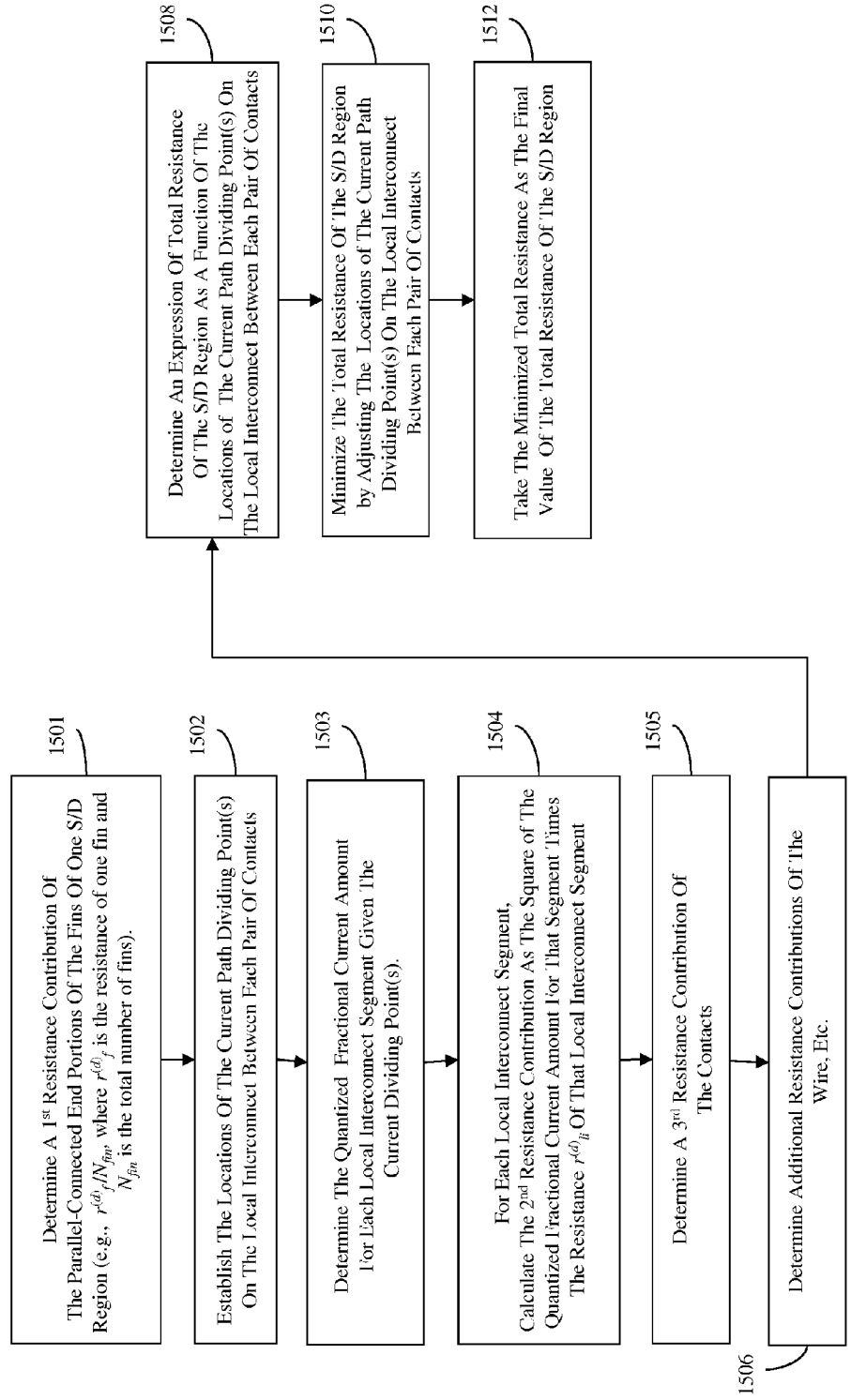
FIG. 15 is a flow diagram further detailing process 6 of FIG. 1 with respect to the multi-fin MUGFETS of FIGS. 6-7 in which the local interconnect is contacted by multiple contacts.

FIG. 15 is a flow diagram illustrating the detailed process steps that can be performed at process step 6 of FIG. 1 in order to determine the various resistance contributions to the total parasitic of a diffusion region (e.g., the total parasitic resistance of the drain region $R_{tot}^{(d)}$) in cases where the local interconnect is contacted by multiple contacts, as shown in the full resistive networks of FIGS. 13 and 14. Specifically, a first resistance contribution of the resistive elements corresponding to the end portions 131 of the semiconductor fins $110_{1-9}$ can be determined in essentially the same manner as described in detail above (1501). That is, this first resistance contribution can take into consideration that the end portions 131 of the semiconductor fins $110_{1-9}$ are connected in pseudo-parallel to the first local interconnect 171. For example, when the end portions 131 of the semiconductor fins $110_{1-9}$ are essentially identical (i.e., when they comprise essentially identical resistive elements each having an essentially identical first resistance value $r_f^{(d)}$), which is typically the case, the first resistance contribution can be calculated as the first resistance value $r_f^{(d)}$ divided by the total number of semiconductor fins $N_{fin}$ (i.e., $r_f^{(d)}/N_{fin}$).

In such cases, the second resistance contribution of each segment of the first local interconnect 171, as defined by the resistive network constructed at process 4, can also similarly be calculated as the square of quantized fractional current amount for that segment times the resistance $r_{lis}^{(d)}$ associated with that local interconnect segment (1504). However, the determination of the quantized factional current amount for each local interconnect segment is more complex than in cases where a single contact lands on the first local interconnect 171, as described above, because only a portion of the source/drain region 181 current flows through each of the multiple contacts.

That is, as shown in the exemplary resistive networks of FIGS. 13 and 14, when there are multiple contacts to the first local interconnect 171 (e.g., see contacts 601-602 in FIG. 13 or contacts 701-704 in FIG. 14), the series-connected segments of the first local interconnect 171 are defined such that each local interconnect segment extends laterally between an end portion of one semiconductor fin and either one of the multiple contacts or an adjacent end portion of an adjacent semiconductor fin, whichever is closer. Since current flow will be divided amongst these contacts, the second resistance contribution of each local interconnect segment can be determined based on the relative positions of the contacts on the first local interconnect, of the local interconnect segment within the first local interconnect 171 and of other local interconnect segments within the first local interconnect 171. To do this, the current path dividing point(s) on the first local interconnect 171 between each pair of adjacent contacts can be established taking into consideration the fact that the current will naturally flow through the path of least resistance (1502). For purposes of this disclosure, a current path dividing point refers to a location on the first local interconnect 171 between adjacent contacts at which the current path splits. It should be understood that the current path split may not be an even split. For example, referring to FIG. 13, the current from the semiconductor fin $110_5$ may be split between contacts 601 and 602 and the split may be an even split (50:50) or an uneven split (e.g., 60:40). Then, the quantized fractional current amount for each local interconnect segment can be determined, given the current path dividing point(s) (1503). Once the quantized fractional current amount for a local interconnect segment is determined, the square of that amount times the resistance of the local interconnect segment ($r_{li}^{(d)}$) can be calculated to determine the second resistance contribution for that local interconnect segment (1504). Next, the third resistance contribution of the multiple contacts (i.e., contacts 601-602 of FIG. 6 and contacts 701-704 of FIG. 7) can be determined (1505) as well as any additional resistance contributions (e.g., of the wire 620 and common node line 630 of FIG. 6 or the wire 720 and via 710 of FIG. 7) (1506).

After the appropriate resistance contributions have been determined at process 106, their sum can be calculated to determine the total parasitic resistance $R_{tot}^{(d)}$ of the first source/drain region 181 at process 8 of FIG. 1. Specifically, referring again to FIG. 15, in this case, an expression of the total resistance of the source/drain region can be determined as a function of the locations of the current dividing point(s) on the local interconnect between each pair of contacts (1508) and this total resistance of the source/drain region can be minimized by adjusting the locations of the current path dividing point(s) on the local interconnect between each pair of contacts (1510). Then, the minimized total resistance can be used at process 12 of FIG. 1 as the final value of the total resistance of the source/drain region (1512).

More specifically, referring to the resistive network of FIG. 13, which corresponds to the multi-fin MUGFET design of FIG. 6 and which can be generated at process 4 of FIG. 1, the following formula can be used at process 1508 of FIG. 15 to calculate the total parasitic resistance $R_{tot}^{(d)}$ of the diffusion region:

$$R = \frac{r_f^{(d)}}{N_{fin}} + \tag{5a}$$

$$\frac{r_{li}^{(d)}}{N_{fin}^2}[s(x_1-1) + A(y,f) + A(x_2-x_1-y, 1-f) + s(N_{fin}-x_2)] +$$

$$\frac{r_{cnt1}^{(d)} + r_{w1}^{(d)}}{N_{fin}^2}(x_1+y-1+f)^2 +$$

$$\frac{r_{cnt2}^{(d)} + r_{w2}^{(d)}}{N_{fin}^2}[N_{fin} - (x_1+y-1+f)]^2,$$

with $$A(y,f)=mf^2+(m-1)mf+\tfrac{1}{6}(m-1)m(2m-1)+(y-m)(m+f)^2, \\ m=\text{int}(y), \tag{5b}$$

where $r_{li}^{(d)}$ is the local interconnect segment resistance when fin pitch is uniform, where $r_{cnt1}^{(d)}$ is the resistance associated with the first contact 601 to the first local interconnect 171, where $r_{cnt2}^{(d)}$ is the resistance associated with the second contact 602 to the first local interconnect 171, where $r_{w1}^{(d)}$ is the wire resistance from the first contact 601 to the beginning of the common wire segment 630, where $r_{w2}^{(d)}$ is the wire resistance from the second contact 602 to the beginning of the common wire segment 630, where $x_1$ is a normalized coordinate of the first contact 601 (equal to 1 at the first fin, equal to 2 at the second fin, equal to 2.5 halfway between the $2^{nd}$ fin and the $3^{rd}$ fin, etc.), where $x_2$ is a normalized coordinate of the second contact 602, where y can take discrete values such that ($x_1+y$) is always an integer, where $s(x)$ function is defined in equation (4b), and where f is the fraction of electric current of fin at ($x_1+y$) going toward the first contact 601 and (1−f) is the fraction of current of fin at ($x_1+y$) going toward the second contact 602. Notice that [A(y, 1)+A ($x_2-x_1-y$, 0)] is a quadratic function of m, and $R_{tot}^{(d)}$ is a quadratic function of f. The values of m and f are found by minimizing $R_{tot}^{(d)}$ with respect to m and f. Additionally, the minimizing procedure of process 1510 of FIG. 15 can be performed as follows:

(a) Set f=1 (or 0) in $R_{tot}^{(d)}$ and treat m as a real number.

(b) Minimize $R_{tot}^{(d)}$ with respect to m, obtain a linear equation for m, and get m.

(c) Round (up) m to an integer and obtain y.

(d) Use the above found optimal value of y in $R_{tot}^{(d)}$, minimize $R_{tot}^{(d)}$ with respect to f, and obtain f.

(e) Use the above optimal values of y and of f in equation (5) and obtain actual parasitic resistance $R_{tot}^{(d)}$ for the source/drain region.

It should be noted that, when $r_{cnt}^{(d)} \gg r_{li}^{(d)}$, ($x_1+y$) approaches $N_{fin}/2$ and when $r_{cnt}^{(d)} \ll r_{li}^{(d)}$, m approaches ($x_2-x_1-1$)/2.

Furthermore, referring to the resistive network of FIG. 14, which corresponds to the multi-fin MUGFET design of FIG. 7 and which can be generated at process 4 of FIG. 1, the following formula can be used at process 1508 of FIG. 15 to calculate the first total parasitic resistance $R_{tot}^{(d)}$ of the first source/drain region 181. Let $x_k$ be a normalized coordinate of the $k^{th}$ contact (equal to 1 at the first fin, equal to 2 at the second fin, equal to 2.5 halfway between the $2^{nd}$ fin and the $3^{rd}$ fin, etc.) and let each ($x_k+y_k$) be an integer and let $f_k$ be the fraction of electric current of fin at ($x_k+y_k$) going toward x=0 direction, and calculate a total parasitic resistance of the drain region using the following general expression:

$$R = \frac{r_f^{(d)}}{N_{fin}} + \quad (6)$$

$$\frac{r_{li}^{(d)}}{N_{fin}^2} \left\{ s(x_1) + \sum_{k=1}^{K-1} [A(y_k, f_k) + A(x_{k+1,k} - y_k, 1 - f_k)] + s(x_{K+1,K}) \right\} +$$

$$\sum_{k=1}^{K} \left( \frac{i_k}{N_{fin}} \right)^2 r_{cnt,k} + \frac{1}{N_{fin}^2} \sum_{j} \left( \frac{I_j}{N_{fin}} \right)^2 r_{w,j}^{(d)},$$

where $x_{k+1,k} = x_{k+1} - x_k$, where $i_k/N_{fin}$ (k=1, 2, ..., K) is the fractional current passing through the kth contact, and where $I_j/N_{fin}$ is the fractional current passing through the jth wire segment. In general, $$I_j = \sum_n i_n.$$

Specifically, for the resistive network of FIG. 13, $$I_k = \sum_{n=1}^{k} i_n, k = 1, 2, \cdots, K,$$

where $i_1 = x_1 + y_1 - 1 + f_1$, where $i_k = x_{k,k-1} - y_{k-1} + y_k - f_{k-1} + f_k$, k=2, 3, ..., K-1, and
where $i_K = N_{fin} - (x_{K-1} + y_{K-1}) + 1 - f_{K-1}$. The values of $y_1, y_2, \ldots, y_{K-1}$ and the values of $f_1, f_2, \ldots, f_{K-1}$ in equation (6) can be found by minimizing $R_{tot}^{(d)}$ with respect to them. Additionally, the minimizing procedure of process 1510 of FIG. 15 can be performed as follows:

i. Set $f_1 = f_2 = \ldots = f_{K-1} = 1$ (or 0) in $R_{tot}^{(d)}$ and treat each of $m_k = \text{int}(y_k)$ (k=1, 2, ..., K-1) as a real number.

ii. Minimize $R_{tot}^{(d)}$ with respect to each of $m_1, m_2, \ldots, m_{K-1}$, get a first set of (K-1) linear algebraic equations for $m_1, m_2, \ldots, m_{K-1}$, solve the first set of linear equations, and obtain $m_1, m_2, \ldots, M_{K-1}$.

iii. Round (up) each of $m_1, m_2, \ldots, m_{K-1}$ to an integer and obtain $y_1, y_2, \ldots, y_{K-1}$.

iv. Use the above found $y_1, y_2, \ldots, y_{K-1}$ in $R_{tot}^{(d)}$, minimize $R_{tot}^{(d)}$ with respect to each of $f_1, f_2, \ldots, f_{K-1}$, get a second set of (K-1) linear algebraic equations for $f_1, f_2, \ldots, f_{K-1}$, solve the second set of linear equations, and obtain $f_1, f_2, \ldots, f_{K-1}$.

v. Based on the values of $y_1, y_2, \ldots, y_{K-1}$ and the values of $f_1, f_2, \ldots, f_{K-1}$, first determine the actual path of electric current from each and every fin (or the split of electric current), and then determine the relative electric current in each local interconnect segment and in each contact.

vi. Use the values of $y_1, y_2, \ldots, y_{K-1}$ and the values of $f_1, f_2, \ldots, f_{K-1}$ in equation (6) and find actual parasitic resistance of source/drain region.

Also disclosed herein are embodiments of a computer system for accurately modeling the total parasitic resistances of the source/drain regions of a multi-fin multi-gate field effect transistor (i.e., a multi-fin MUGFET). The computer system can be implemented, for example, in a computer hardware environment such as that described in detail below and depicted in FIG. 16. Specifically, the computer system can comprise at least a memory that stores the above-described design for a multi-fin MUGFET and one or more processor(s) that access the design and perform the above-described steps for modeling the total parasitic resistances of the source/drain regions of a multi-fin multi-gate field effect transistor (i.e., a multi-fin MUGFET). Also disclosed herein are embodiments of a non-transitory program storage device. This program storage device can be readable by a computer and can tangibly embody a program of instructions that is executable by the computer to perform the above-described method for accurately modeling the total parasitic resistances of the source/drain regions of a multi-fin multi-gate field effect transistor (i.e., a multi-fin MUGFET).

More particularly, as will be appreciated by one skilled in the art, aspects of the present invention may be embodied as a method, a system or program storage device (i.e., a computer program product). Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a non-transitory computer readable storage medium or computer readable signal medium. A computer readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 16:
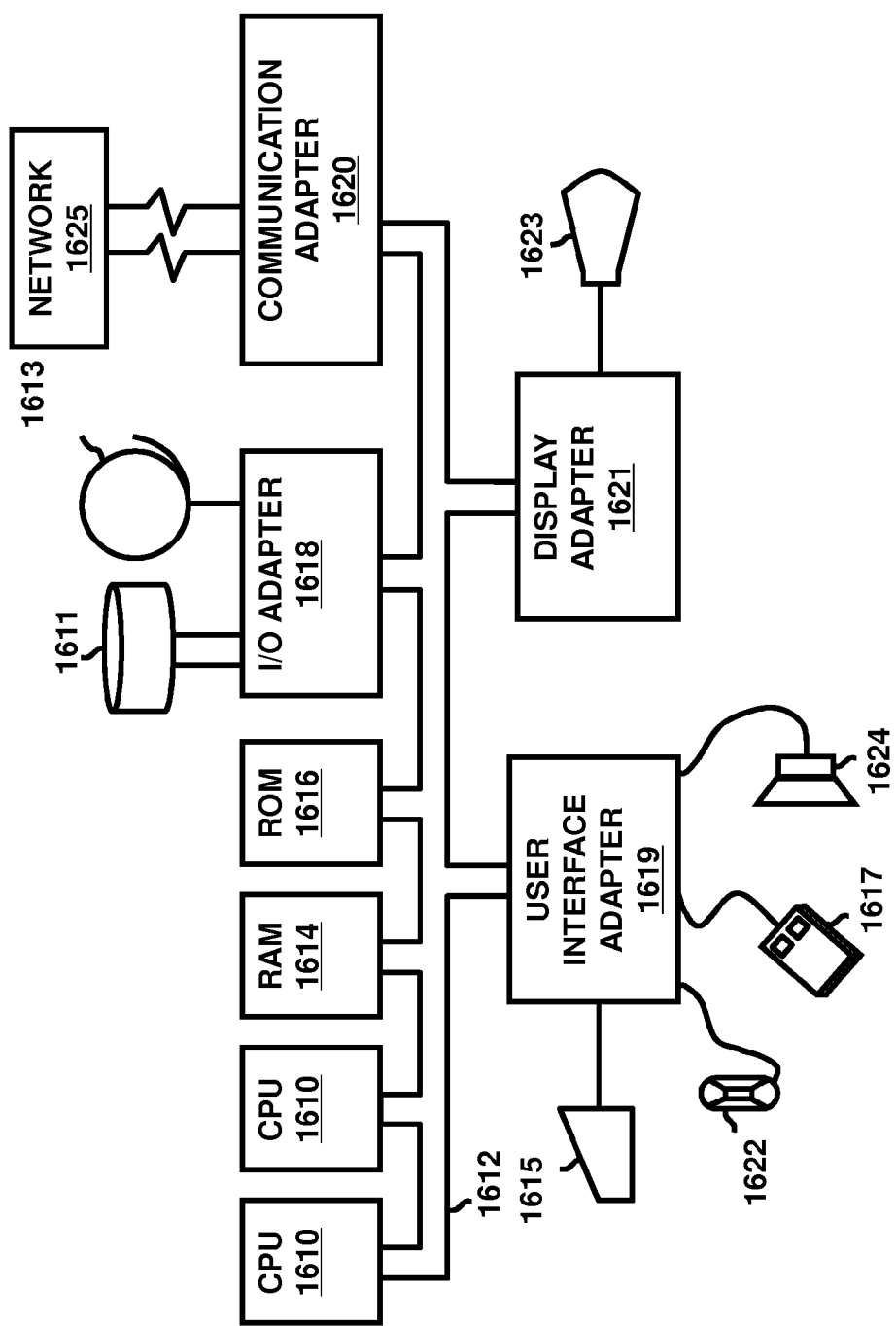
FIG. 16 is schematic diagram illustrating an exemplary hardware environment that can be used to implement the embodiments disclosed herein.

A representative hardware environment for practicing the method, system and program storage device embodiments of the invention is depicted in FIG. 16. This schematic drawing illustrates a hardware configuration of an information handling/computer system in accordance with the embodiments of the invention. The system comprises at least one processor or central processing unit (CPU) 1610. The CPUs 1610 are interconnected via system bus 1612 to various devices such as a random access memory (RAM) 1614, read-only memory (ROM) 1616, and an input/output (I/O) adapter 1618. The I/O adapter 1618 can connect to peripheral devices, such as disk units 1611 and tape drives 1613, or other program storage devices that are readable by the system. The system can read the inventive instructions on the program storage devices and follow these instructions to execute the methodology of the embodiments of the invention. The system further includes a user interface adapter 1619 that connects a keyboard 1615, mouse 1617, speaker 1624, microphone 1622, and/or other user interface devices such as a touch screen device (not shown) to the bus 1612 to gather user input. Additionally, a communication adapter 1620 connects the bus 1612 to a data processing network 1625, and a display adapter 1621 connects the bus 1612 to a display device 1623 which may be embodied as an output device such as a monitor, printer, or transmitter, for example.

It should be understood that the flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should further be understood that the terminology used herein is for the purpose of describing particular embodiments only and is not intended to be limiting of the invention. As used herein, the singular forms "a", an and the are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Therefore, disclosed above are embodiments of a method, system and program storage device for accurately modeling the total parasitic resistances of the source/drain regions of a multi-fin multi-gate field effect transistor (i.e., a multi-fin MUGFET). Specifically, in the embodiments, a resistive network is constructed for a multi-fin MUGFET design and, using this resistive network, various resistance contributions to the total parasitic resistance associated with the diffusion region of the MUGFET are determined. These resistance contributions include the following: a first resistance contribution of end portions of the semiconductor fins, which are connected in pseudo-parallel by a local interconnect; second resistance contributions of segments of the local interconnect, which are connected in pseudo-series; and any other resistance contributions of any other resistive elements, which are within the resistive network between the end portions of the semiconductor fins and a single resistive element through which all the diffusion region current flows. It should be noted that each second resistance contribution of each segment of the local interconnect is particularly determined based on a quantized fractional current amount flowing through that segment given the relative positions, within the resistive network, of contact(s) on the local interconnect, of the segment within the local interconnect and of other segments within the local interconnect. Then, the multi-fin MUGFET can be represented in a netlist (e.g., a Simulation Program with Integrated Circuit Emphasis (SPICE) netlist) as a simple field effect transistor with the total parasitic resistances represented as single resistive elements connected to the source/drain nodes of the simple field effect transistor. This simplified netlist can then be used to simulate performance of the multi-fin MUGFET.

What is claimed is:

1. A modeling method comprising:
  accessing, by a computer from a memory, a design for a multi-fin field effect transistor, said multi-fin field effect transistor comprising:
    multiple semiconductor fins;
    a gate structure traversing center portions of said multiple semiconductor fins;
    a first local interconnect electrically connecting end portions of said multiple semiconductor fins on a first side of said gate structure;
    a second local interconnect electrically connecting end portions of said multiple semiconductor fins on a second side of said gate structure opposite said first side; and
    a single contact to said first local interconnect;
  determining, by said computer, a first total parasitic resistance associated with a first source/drain region of said multi-fin field effect transistor on said first side of said gate structure and a second total parasitic resistance associated with a second source/drain region on said second side of said gate structure, said first total parasitic resistance comprising being equal to a sum of the following:
    a first resistance contribution of said end portions of said fins;
    second resistance contributions of segments of said local interconnect, each second resistance contribution being associated with a corresponding segment of said local interconnect and further being dependent on relative positions of said contact on said local interconnect and of said corresponding segment within said local interconnect; and
    a third resistance contribution of said contact,
    said first resistance contribution, said second resistance contributions and said third resistance contribution all comprising resistance values and said sum being a result of adding said resistance values;
  representing, by said computer in a netlist, said multi-fin field effect transistor as a simple field effect transistor; and
  representing, by said computer in said netlist, said first total parasitic resistance by a first resistive element connected to a first source/drain node of said simple field effect transistor and said second total parasitic resistance by a second resistive element connected to a second source/drain node of said simple field effect transistor.

2. The modeling method of claim 1, further comprising using said netlist to simulate performance of said multi-fin field effect transistor.

3. The modeling method of claim 1, further comprising, when said end portions of said fins are electrically connected in pseudo-parallel by said local interconnect and comprise essentially identical resistors each having an essentially identical first resistance value, calculating, by said computer, said first resistance contribution as said first resistance value divided by a total number of said multiple semiconductor fins.

4. The modeling method of claim 1, further comprising constructing, by said computer, a resistive network that defines said segments of said local interconnect such that each segment extends laterally between an end portion of a semiconductor fin and the closer of said contact and an adjacent end portion of an adjacent semiconductor fin.

5. The modeling method of claim 1, said second resistance contribution of said corresponding segment comprising a product of the square of a quantized fractional current amount for said corresponding segment and a second resistance value for said corresponding segment.

6. The modeling method of claim 5, said quantized fractional amount comprising a number of said multiple semiconductor fins with a current path through said corresponding segment divided by a total number of said multiple semiconductor fins.

7. A modeling method comprising:
  accessing, by a computer from a memory, a design for a multi-fin field effect transistor, said multi-fin field effect transistor comprising:
    multiple semiconductor fins;
    a gate structure traversing center portions of said multiple semiconductor fins;
    a first local interconnect electrically connecting end portions of said multiple semiconductor fins on a first side of said gate structure;
    a second local interconnect electrically connecting end portions of said multiple semiconductor fins on a second side of said gate structure opposite said first side; and
    a wire; and
    multiple contacts extending vertically between said wire and said first local interconnect; and
  determining, by said computer, a first total parasitic resistance associated with a first source/drain region of said multi-fin field effect transistor on said first side of said gate structure and a second total parasitic resistance associated with a second source/drain region on said second side of said gate structure, said first total parasitic resistance being equal to a sum of the following:
    a first resistance contribution of said end portions of said fins on said first side of said gate structure;
    second resistance contributions of segments of said first local interconnect, each second resistance contribution being associated with a corresponding segment of said first local interconnect and further being dependent on relative positions of said contacts on said first local interconnect and of said corresponding segment within said first local interconnect;
    third resistance contributions of said contacts; and
    fourth resistance contributions of segments of said wire
    said first resistance contribution, said second resistance contributions, said third resistance contributions and said fourth resistance contributions all comprising resistance values and said sum being a result of adding said resistance values;
  representing, by said computer in a netlist, said multi-fin field effect transistor as a simple field effect transistor; and
  representing, by said computer in said netlist, said first total parasitic resistance by a first resistive element connected to a first source/drain node of said simple field effect transistor and said second total parasitic resistance by a second resistive element connected to a second source/drain node of said simple field effect transistor.

8. The modeling method of claim 7, further comprising using said netlist to simulate performance of said multi-fin field effect transistor.

9. The modeling method of claim 7, further comprising, when said end portions of said fins are electrically connected in pseudo-parallel by said first local interconnect and comprise essentially identical resistors each having an essentially identical first resistance value, calculating, by said computer, said first resistance contribution as said first resistance value divided by a total number of said multiple semiconductor fins.

10. The modeling method of claim 7, further comprising constructing, by said computer, a resistive network that defines said segments of said first local interconnect such that each segment of said first local interconnect extends laterally between an end portion of a semiconductor fin and the closer of one of said contacts and an adjacent end portion of an adjacent semiconductor fin and that further defines said segments of said wire such that all of said contacts are connected by said wire.

11. The modeling method of claim 10, further comprising:
establishing, by said computer, current path dividing points on said first local interconnect between each pair of adjacent contacts; and
based on said current path dividing points, determining fractional current amounts in said segments of said local interconnect, fractional current amounts in said contacts, and fractional current amount in said segments of said wire.

12. The modeling method of claim 11,
said second resistance contribution of said corresponding segment of said first local interconnect comprising a product of the square of a fractional current amount for said corresponding segment of said first local interconnect and a second resistance value for said corresponding segment of said first local interconnect,
each third resistance contribution of each corresponding contact comprising a product of the square of a fractional current for said corresponding contact and a third resistance value of said corresponding contact, and
each fourth resistance contribution of each corresponding segment of said wire comprising a product of the square of a fractional current amount for said corresponding segment of said wire and a fourth resistance value for said corresponding segment.

13. A modeling system comprising:
a memory storing a design for a multi-fin field effect transistor, said multi-fin field effect transistor comprising:
multiple semiconductor fins;
a gate structure traversing center portions of said multiple semiconductor fins;
a first local interconnect electrically connecting end portions of said multiple semiconductor fins on a first side of said gate structure;
a second local interconnect electrically connecting end portions of said multiple semiconductor fins on a second side of said gate structure opposite said first side; and
a single contact to said first local interconnect; and
at least one processor accessing said design and further performing the following:
analyzing said design to determine a first total parasitic resistance associated with a first source/drain region of said multi-fin field effect transistor on said first side of said gate structure and a second total parasitic resistance associated with a second source/drain region on said second side of said gate structure, said first total parasitic resistance comprising being equal to a sum of the following:
a first resistance contribution of said end portions of said fins;
second resistance contributions of segments of said local interconnect, each second resistance contribution being associated with a corresponding segment of said local interconnect and further being dependent on relative positions of said contact on said local interconnect and of said corresponding segment within said local interconnect; and
a third resistance contribution of said contact,
said first resistance contribution, said second resistance contributions and said third resistance contribution all comprising resistance values and said sum being a result of adding said resistance values;
representing, in a netlist, said multi-fin field effect transistor as a simple field effect transistor; and
representing, in said netlist, said first total parasitic resistance by a first resistive element connected to a first source/drain node of said simple field effect transistor and said second total parasitic resistance by a second resistive element connected to a second source/drain node of said simple field effect transistor.

14. The modeling system of claim 13, said at least one processor further using said netlist to simulate performance of said multi-fin field effect transistor.

15. The modeling system of claim 13, when said end portions of said fins are electrically connected in pseudo-parallel by said local interconnect and comprise essentially identical resistors each having an essentially identical first resistance value, said at least one processor calculating said first resistance contribution as said first resistance value divided by a total number of said multiple semiconductor fins.

16. The modeling system of claim 13, said at least one processor further constructing a resistive network that defines said segments of said local interconnect such that each segment extends laterally between an end portion of a semiconductor fin and the closer of said contact and an adjacent end portion of an adjacent semiconductor fin.

17. The modeling system of claim 16, said second resistance contribution of said corresponding segment comprising a product of the square of a quantized fractional current amount for said corresponding segment and a second resistance value for said corresponding segment.

18. The modeling system of claim 17, said quantized fractional amount comprising a number of said multiple semiconductor fins with a current path through said corresponding segment divided by a total number of said multiple semiconductor fins.

19. A modeling system comprising:
a memory storing a design for a multi-fin field effect transistor, said multi-fin field effect transistor comprising:
multiple semiconductor fins;
a gate structure traversing center portions of said multiple semiconductor fins;
a first local interconnect electrically connecting end portions of said multiple semiconductor fins on first side of said gate structure;
a second local interconnect electrically connecting end portions of said multiple semiconductor fins on a second side of said gate structure opposite said first side; and
a wire; and
multiple contacts extending vertically between said wire and said first local interconnect; and at least one processor performing the following:
- accessing said design;
- analyzing said design to determine a first total parasitic resistance associated with a first source/drain region of said multi-fin field effect transistor on said first side of said gate structure and a second total parasitic resistance associated with a second source/drain region on said second side of said gate structure, said first total parasitic resistance comprising being equal to a sum of the following:
  - a first resistance contribution of said end portions of said fins on said first side of said gate structure;
  - second resistance contributions of segments of said first local interconnect, each second resistance contribution being associated with a corresponding segment of said first local interconnect and further being dependent on relative positions of said contacts on said first local interconnect and of said corresponding segment within said first local interconnect; and
  - third resistance contributions of said contacts,
  - fourth resistance contributions of segments of said wire,
  - said first resistance contribution, said second resistance contributions, said third resistance contributions and said fourth resistance contributions all comprising resistance values and said sum being a result of adding said resistance values;
- representing, in a netlist, said multi-fin field effect transistor as a simple field effect transistor; and
- representing, in said netlist, said first total parasitic resistance by a first resistive element connected to a first source/drain node of said simple field effect transistor and said second total parasitic resistance by a second resistive element connected to a second source/drain node of said simple field effect transistor.

20. The modeling system of claim 19, said at least one processor further using said netlist to simulate performance of said multi-fin field effect transistor.

21. The modeling system of claim 19, when said end portions of said fins are electrically connected in pseudo-parallel by said first local interconnect and comprise essentially identical resistors each having an essentially identical first resistance value, said at least one processor calculating said first resistance contribution as said first resistance value divided by a total number of said multiple semiconductor fins.

22. The modeling system of claim 19, said at least one processor further constructing a resistive network that defines said segments of said first local interconnect such that each segment of said first local interconnect extends laterally between an end portion of a semiconductor fin and the closer of one of said contacts and an adjacent end portion of an adjacent semiconductor fin and that further defines said segments of said wire such that all of said contacts are connected by said wire.

23. The modeling system of claim 22, said at least one processor further performing the following:
- establishing current path dividing points on said first local interconnect between each pair of adjacent contacts; and
- based on said current path dividing points, determining fractional current amounts in said segments of said local interconnect, fractional current amounts in said contacts, and fractional current amount in said segments of said wire.

24. The modeling system of claim 19,
- said second resistance contribution of said corresponding segment of said first local interconnect comprising a product of the square of a fractional current amount for said corresponding segment of said first local interconnect and a second resistance value for said corresponding segment of said first local interconnect,
- each third resistance contribution of each corresponding contact comprising a product of the square of a fractional current for said corresponding contact and a third resistance value of said corresponding contact, and
- each fourth resistance contribution of each corresponding segment of said wire comprising a product of the square of a fractional current amount for said corresponding segment of said wire and a fourth resistance value for said corresponding segment.

* * * * *